(12) United States Patent
Rozen et al.

(10) Patent No.: US 11,362,274 B2
(45) Date of Patent: Jun. 14, 2022

(54) LATERALLY SWITCHING CELL HAVING SUB-STOICHIOMETRIC METAL OXIDE ACTIVE LAYER

(71) Applicants: International Business Machines Corporation, Armonk, NY (US); ULVAC, Inc., Shizuoka (JP)

(72) Inventors: John Rozen, Hastings on Hudson, NY (US); Takashi Ando, Eastchester, NY (US); Martin M. Frank, Dobbs Ferry, NY (US); Yohei Ogawa, White Plains, NY (US)

(73) Assignees: International Business Machines Corporation, Armonk, NY (US); ULVAC, INC., Shiuoka (JP)

( * ) Notice: Subject to any disclaimer, the term of this patent is extended or adjusted under 35 U.S.C. 154(b) by 161 days.

(21) Appl. No.: 16/740,163

(22) Filed: Jan. 10, 2020

(65) Prior Publication Data
US 2021/0217953 A1    Jul. 15, 2021

(51) Int. Cl.
*H01L 45/00* (2006.01)

(52) U.S. Cl.
CPC ...... *H01L 45/1616* (2013.01); *H01L 45/1253* (2013.01); *H01L 45/145* (2013.01)

(58) Field of Classification Search
CPC . H01L 45/1226; H01L 45/124; H01L 45/146; H01L 45/1616
See application file for complete search history.

(56) References Cited

U.S. PATENT DOCUMENTS

| | | | |
|---|---|---|---|
| 7,691,758 B2 | 4/2010 | Iwaki | |
| 8,772,106 B2 | 7/2014 | Lee et al. | |
| 9,018,037 B1 | 4/2015 | Nardi et al. | |
| 9,184,378 B2 | 11/2015 | Choi et al. | |
| 9,735,356 B2 | 8/2017 | Rupp et al. | |
| 10,361,368 B2 | 7/2019 | Ando et al. | |
| 11,081,343 B2* | 8/2021 | Rozen | H01L 21/02244 |
| 2013/0077379 A1 | 3/2013 | Matsudaira et al. | |
| 2017/0236869 A1 | 8/2017 | Tran et al. | |
| 2019/0131525 A1 | 5/2019 | Ando et al. | |

OTHER PUBLICATIONS

U.S. Appl. No. 16/516,423, filed Jul. 19, 2019.
(Continued)

*Primary Examiner* — Mark V Prenty
(74) *Attorney, Agent, or Firm* — L. Jeffrey Kelly; Otterstedt, Wallace & Kammer, LLP

(57) ABSTRACT

A laterally switching cell structure including a metal-insulator-metal stack includes an active metal oxide layer including one or more sub-stoichiometric regions. The metal oxide layer includes one or more metal-oxides deposited conformally using a mixed precursor atomic layer deposition process. A graded oxygen profile in the metal oxide layer(s) of the stack including a mirrored impurity density may be formed wherein the sub-stoichiometric region(s) include a relatively high density of impurities obtained as reaction by-products. Arrays of cell structures can be formed with no requirement for a thick active electrode, allowing for more space for a metal fill and optional selector, thereby reducing access resistance.

7 Claims, 18 Drawing Sheets

(56) References Cited

OTHER PUBLICATIONS

Y. Hayakawa et al., Highly reliable TaOx ReRAM with centralized filament for 28-nm embedded application, 2015 Symposium on VLSI Technology Digest of Technical Papers, pp. T14-T15.
G. Baek et al., Realization of Vertical Resistive Memory (VRRAM) using cost effective 3D Process, IEDM11-737-IEDM11-740, 2011 p. 737-740.
H. S. Philip Wong et al., Metal-Oxide RRAM, Proceedings of the IEEE, vol. 100, No. 6, Jun. 6, 2012, pp. 1951-1970.
Chien, W.C. et al., Multi-layer sidewall Wox resistive memory suitable for 3D ReRAM, Symposim on VLSI Technology, Jun. 2012, pp. 153-154.

* cited by examiner

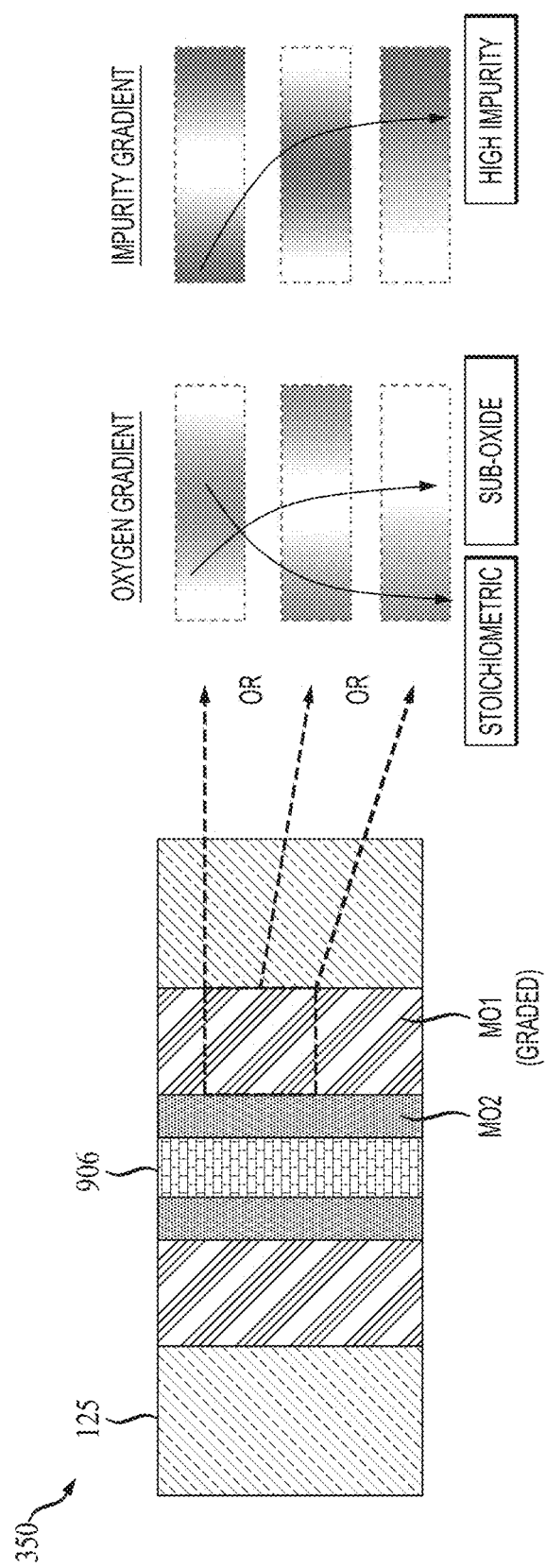

LATERALLY SWITCHING CELL HAVING SUB-STOICHIOMETRIC METAL OXIDE ACTIVE LAYER

BACKGROUND

The present application relates generally to laterally switching thin film devices such as memory devices and the fabrication thereof.

Resistive random access memory (a.k.a. RRAM or ReRAM) is considered a promising technology for electronic synapse devices or memristors for neuromorphic computing as well as high-density and high-speed non-volatile memory applications. In neuromorphic computing applications, a resistive memory device can be used as a connection (synapse) between a pre-neuron and post-neuron, representing the connection weight in the form of device resistance. Multiple pre-neurons and post-neurons can be connected through a crossbar array of RRAMs, which naturally expresses a fully-connected neural network. The density of RRAMs can be increased by vertically stacking RRAM stacks as practiced in Flash NAND technology. However, RRAM stacks are typically deposited by Physical Vapor Deposition (PVD) to control the oxygen vacancy concentration in the metal oxide layer and this prevents application to three-dimensional (3D) structures.

SUMMARY

Laterally switching cell structures and techniques for fabricating such structures are provided.

In one aspect, an exemplary method of fabricating a laterally switching cell structure includes obtaining a first structure that includes a first electrode layer including a plurality of discrete first electrode segments, a second electrode layer above the first electrode layer and including a plurality of discrete second electrode segments, the first and second electrode layers [54] being embedded within a dielectric layer, and a metal layer, the dielectric layer being positioned above the metal layer. A plurality of vertical vias are formed through the first structure down to the metal layer. Each of the vertical vias extends through one of the first electrode segments and one of the second electrode segments. A conformal metal oxide layer including one or more sub-stoichiometric regions is deposited on the first structure and includes portions adjoining the first electrode segments and the second electrode segments. Deposition of the conformal metal oxide layer includes exposing the first structure to a first precursor during a first pulse of an atomic layer deposition (ALD) cycle, the first precursor including a metal and a first ligand, exposing the first structure to a second precursor during a second pulse of the ALD cycle, the second pulse occurring directly after the first pulse, the second precursor including the metal and a second ligand, the first ligand and the second ligand reacting during the second pulse to form one or more reaction by-products, and exposing the first structure to an oxidant during a third pulse of the ALD cycle. An inner electrode layer is deposited on the first structure. The inner electrode layer extends within the vias and adjoins the conformal metal oxide layer.

An electronic structure according to the invention includes one or more laterally switching cell structures. The electronic structure includes a dielectric substrate, a via extending vertically within the dielectric substrate, and a conformal metal oxide layer within the via and including one or more sub-stoichiometric regions. The one or more sub-stoichiometric regions further include atomic layer deposition reaction by-products therein. An inner electrode layer including a metal fill layer extends within the via and adjoins an inner surface of the conformal metal oxide layer. An outer electrode layer adjoins an outer surface of the conformal metal oxide layer. The conformal metal oxide layer, the inner electrode layer and the outer electrode layer form a first cell structure configured for lateral switching.

Techniques as disclosed herein can provide substantial beneficial technical effects. By way of example only and without limitation, one or more embodiments may provide one or more of the following advantages:

- enables high aspect ratio structures;
- no requirement for a scavenging electrode in forming sub-stoichiometric metal oxide layer;
- no requirement for a thick active electrode, allowing for more space for the metal fill and optional selector, therefore reducing access resistance;
- enables tuning of the device resistance and forming properties independent of the electrode and footprint;
- oxide thickness can be thinned to reduce operating voltage and help deterministic filament formation at a small pitch;
- avoids etch damage in the metal-oxide.

BRIEF DESCRIPTION OF THE DRAWINGS

The following drawings are presented by way of example only and without limitation, wherein like reference numerals (when used) indicate corresponding elements throughout the several views, and wherein:

FIG. 9AA is a perspective view of one embodiment of a resistive random access memory (RRAM) device having a cross-bar architecture.

FIG. 9BB is a cross-sectional view showing a portion of the structure shown in FIG. 9AA;

FIG. 13BB is a cross-sectional view taken along line x-x' of FIG. 13B;

FIG. 13DD is a cross-sectional view taken along line x-x' of FIG. 13D;

FIG. 14A is a cross-sectional view of a portion of an exemplary device including multiple metal oxide layers; and FIG. 14B is a schematic illustration of oxygen and impurity gradients in one of the metal oxide layers shown in FIG. 14A.

Figure 1:
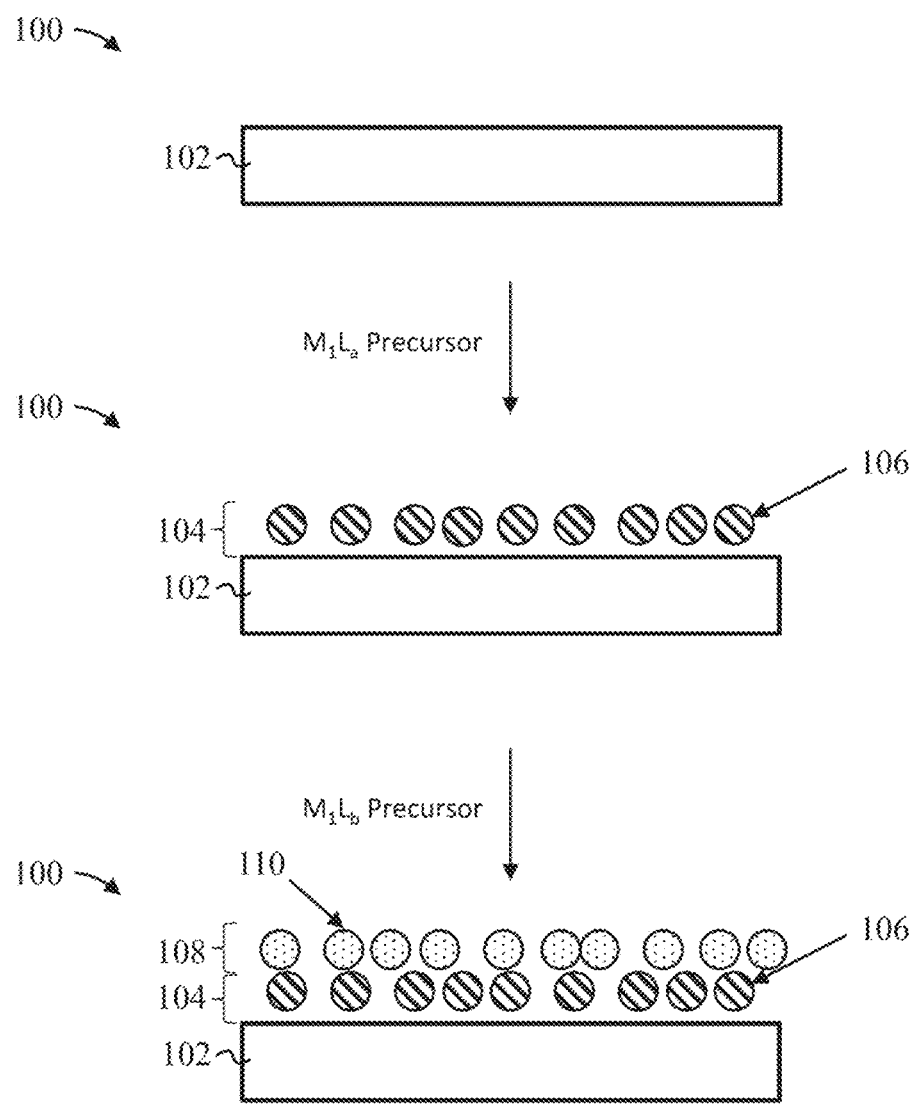
FIG. 1 depicts a cross-sectional view illustrating a structure that results from performing initial fabrication operations in accordance with embodiments of the invention.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

The present disclosure is directed to a resistive switching memory stack for three-dimensional structures. More particularly, the methods and structures described herein provide for a confined lateral switching cell for high density scaling of resistive memory stacks. As used herein, the term "memory device" means a structure in which the electrical state can be altered and then retained in the altered state, in this way a bit of information can be stored.

In some vertical resistive memory (VRRAM) devices, a material stack of an atomic layer deposition (ALD) deposited tantalum oxide layer/barrier layer and chemical vapor deposition (CVD) deposited titanium nitride (TiN) layers has been proposed for resistive random access memory (RRAM) stacks around vertical electrodes. The inability to control film stoichiometry in high aspect ratio architecture with ALD and the use of a CVD scavenging electrode prevents effective scaling. Sub-oxide layer resistance cannot be tuned independently from a PVD scavenging layer in devices including such a layer.

Three-dimensional cross-point RRAMs are characterized by stacked X-point arrays having metal lines that orthogonally cross over one another and memory cells formed where the lines cross. VRRAMs can include vertical NAND-like architectures. In some embodiments, the aforementioned disadvantages are overcome by the structures and methods provided herein that include a lateral switching confined cell structure in a cross-point architecture using conformal metal-insulator-metal stack that is enabled by atomic layer deposition (ALD). The term "conformal" denotes a layer having a thickness that does not deviate from greater than or less than 30% of an average value for the thickness of the layer. Conformal layers as employed in accordance with the invention preferably do not deviate more than 10% from the average layer thickness. Accordingly, layer thickness is substantially uniformly maintained on both lateral and vertical surfaces of a structure when deposited thereon, including surfaces of high aspect ratio structures that may be employed. In some embodiments, the high aspect ratio structures to which conformal layers are applied have vertical and lateral dimensions having ratios of ten to one (10:1) or greater.

Atomic layer deposition (ALD) is a thin film deposition method in which a film is grown on a substrate by exposing its surface to alternate gaseous species (typically referred to as precursors). In contrast to chemical vapor deposition, the precursors in ALD are never present simultaneously in the reactor, but instead are inserted as a series of sequential, non-overlapping pulses. In each pulse, the precursor molecules react with the surface in a self-limiting way, so that the reaction terminates once all the reactive sites on the surface are consumed. Consequently, the maximum amount of material deposited on the surface after a single exposure to all of the precursors (a.k.a. an ALD cycle) is determined by the nature of the precursor-surface interaction. By varying the number of ALD cycles, it is possible to grow materials uniformly and with high precision on arbitrarily complex and large substrates such as three-dimensional structures.

In some embodiments, a conformal inert metal, e.g., titanium nitride (TiN), is used for the side and bottom/outer electrode of a vertical resistive random access memory (VVRAM) structure. In some embodiments, conformal metal oxide films, e.g., hafnium oxide ($HfO_x$) and/or tantalum oxide ($TaO_x$), are used as a filament forming layer. The filament layer comprises a sub-stoichiometric (metal rich) active layer in the form of single or multiple metal-oxides deposited using ALD. The lateral oxygen profile in one or more of the metal-oxide layers includes a mirrored, laterally graded impurity content, the impurities being provided by ligands employed during ALD. In some embodiments, conformal inner electrodes, e.g., titanium (Ti) rich titanium nitride (TiN) and/or titanium aluminum carbide ((Ti)AlC) containing stacks, and/or a metal fill, e.g., titanium nitride (TiN), tungsten (W), aluminum (Al), copper (Cu) and combinations thereof, are formed in the remaining vertical gap.

While oxygen scavenging electrodes such as metal rich titanium nitride may be employed, they are not required to in the formation of the sub-stoichiometric region(s) of the metal oxide layer and inert (stoichiometric) forms of titanium nitride or other electrically conductive compound can be used. Inert metal may also be employed as side electrodes in the form of plates in embodiments wherein VRRAM devices are to be fabricated or inner/bottom electrodes for three-dimensional cross-point RRAMs. In some embodiments, the structures that are provided herein enable area modulation of the cell in the vertical direction at a given cross-bar pitch. The cell footprint and metal oxide may be decoupled by the methods and structures provided herein. In some embodiments, the methods and structures of the present disclosure provide vertical scaling that allows for the active oxide area to be higher than the line width. Additionally, the oxide thickness can be thinned to reduce the operating voltage. In some embodiments, the active oxide area by vertical scaling can be tuned to ensure deterministic filament formation at a small pitch due to the large metal-oxide area, reducing the potential for cell-to-cell switching property variation. The methods provided herein can facilitate eliminating etch damage to the metal oxide related to patterning in the horizontal direction between the inert and active electrodes using a confined cell scheme. Risk of uncontrolled switching at processing-induced defect sites, which occurs at the vertical boundaries of cells deposited by physical vapor deposition (PVD) and patterned by reactive ion etching (RIE), may also be eliminated.

In some embodiments, the methods and structures provided herein can produce a resistive random access memory (RRAM or ReRAM) cell, in which the unit cell area can be tuned independently from the electrode dimensions. This enables low metal line resistances and optimization of resistive random access memory switching characteristics simultaneously. For example, the methods and structures provided herein can maximize the metal oxide area for minimum set voltage; and can minimize edge effects. Further, the methods and structures provided herein can increase current density in the electrode/selector independent of the metal oxide area. Additionally, the methods and structures provided herein can substantially eliminate metal oxide etch damage near the active region of the memory device. The methods and structures of the present disclosure are now described with more detail with reference to the figures.

Techniques in accordance with aspects of the invention leverage mixed precursor reactions having the same metal but different ligands to form thin-film suboxides in thin film devices such as RRAMs. Consider the deposition of ALD metal precursors P1 and P2, where P1 includes a first metal and a first ligand (e.g., M1La) and P2 includes the first metal and a second ligand (e.g., M1Lb). In some embodiments of the invention, M1Lb pulses occur right after M1La pulses, with or without intervening thermal oxidant (or other reactant) pulses. If no thermal oxidant (denoted "O") is used, the ALD cycle is combined with a standard metal-oxide ALD cycle in an ALD super-cycle. FIGS. 1-8 depict cross-sectional views of a portion of a semiconductor wafer/structure 100 after fabrication operations for forming a sub-stoichiometric metal-oxide stack (shown in FIG. 8) from an ALD process using (M1La-M1Lb-O).x+(M1La–M1Lb).y+(M1La or M1Lb).z ALD super-cycles according to embodiments of the invention. Such fabrication operations may be employed in the fabrication of the devices described below. Such super-cycles can be repeated to obtain a continuous thin film having a targeted thickness.

In some embodiments, a film of constant intermediate sub-stoichiometry resulting from mixing an oxide and a sub-oxide material during ALD processing is obtained. An ALD super-cycle causing deposition, respectively, of sub-oxide, sub-oxide, and stoichiometric oxide sub-layers can be employed to form such a film. For example, (M1La-M1Lb-O).x+(M1La-M1Lb).y+(M1La-O or M1Lb-O).z ALD super-cycles at 400° C. or less can be employed to obtain a metal oxide film having constant intermediate sub-stoichiometry and ALD by-product impurity concentrations throughout the resulting metal oxide layer.

Figure 9A:
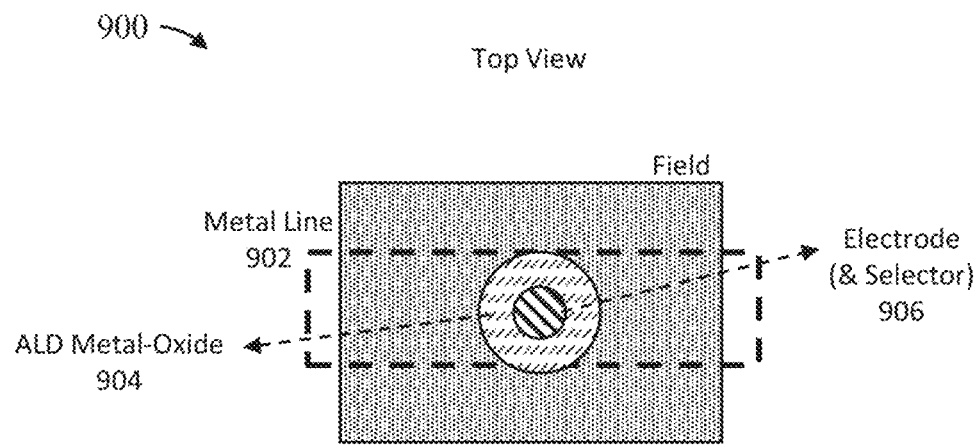
FIG. 9A depicts a top-down view of a structure after fabrication operations in accordance with embodiments of the invention.

FIG. 9AA is a perspective view of one embodiment of a resistive random access memory (RRAM) device having a cross-bar architecture. The cross-bar architecture refers to the positioning of a memory cell, such as a resistive random access memory (RRAM) cell 120, between an upper contact line 121 and a lower contact line 122, and refers to the directions of travel for the upper and lower contact lines 121, 122. Resistive random-access memory (RRAM or ReRAM) is a type of non-volatile (NV) random-access (RAM) memory that works by changing the resistance across a dielectric solid-state material. In some instances, the RRAM or ReRAM may be referred to as a memresistor.

The upper contact line 121 and the lower contact line 122 extend within parallel planes but may have directions that are perpendicular to one another, as depicted in FIG. 9AA. The single random access memory device having the cross-bar architecture that is depicted in FIG. 9AA may be integrated into an array of like devices. In the embodiment that is depicted in FIG. 9AA, the upper contact line 121 is in electrical contact with an inner electrode 20 (shown in FIG. 9BB) of the resistive random access memory cell 120. In one embodiment that is depicted in FIG. 9AA, the lower contact line 122 is in electrical contact with an inert electrode 10 (shown in FIG. 9BB) of the resistive random access memory cell 120. Each of the upper contact line 121 and the lower contact line 122 may be composed of an electrically conductive material. Metals that are suitable for the upper contact line 121 and the lower contact line 122 include, for example, aluminum (Al), copper (Cu), gold (Au), platinum (Pt), silver (Ag), tantalum (Ta), titanium (Ti), tungsten (W) and combinations and alloys thereof. In some examples, a nitride, e.g., titanium nitride (TiN), tantalum nitride (TaN), or tungsten nitride (WN), can be used to form at least one of the upper contact line 121 and the lower contact line 122. The upper contact line 121 may also be referred to as a top cross-bar line or a bit line. The lower contact line 122 may also be referred to as a bottom cross-bar line or a word line.

The structure depicted in FIG. 9AA may include a vertically extending via containing the resistive random access memory (RRAM) cell 120. The via extends through an interlevel dielectric (ILD) layer (not depicted in FIG. 9AA). The interlevel dielectric layer has been omitted from FIG. 9AA to provide an unobstructed view of the memory device having the cross-bar architecture, but is identified by reference number 125 in FIG. 9BB. The interlevel dielectric layer may have a composition that is selected from the group consisting of silicon containing materials such as $SiO_2$, $SiN_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H. Additional choices for the interlevel dielectric layer include any of the aforementioned materials in porous form, or in a form that changes during processing to or from being porous and/or permeable to being non-porous and/or non-permeable.

Figure 9B:
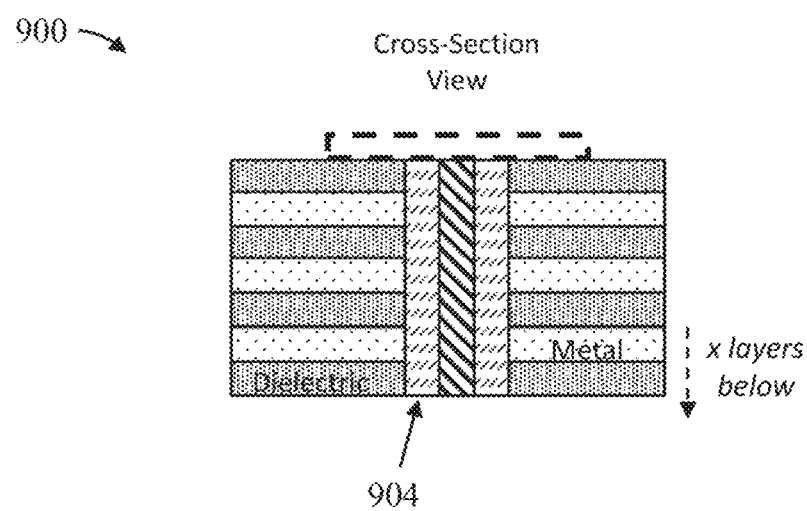
FIG. 9B depicts a cross-sectional view of the structure of FIG. 9A after fabrication operations in accordance with embodiments of the invention.
Figure 9A:
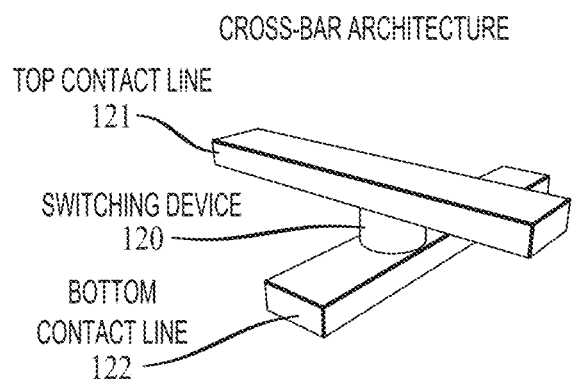
Figure 9B:
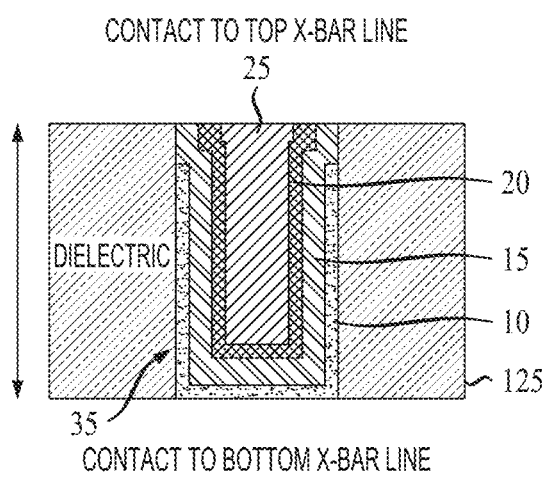

FIG. 9BB depicts an exemplary resistive random access memory device including a resistive random access memory (RRAM) cell 120. The memory device includes a via extending 35 through the interlevel dielectric layer 125. The cell 120 is within the via 35. When viewed from a top-down perspective, the via 35 may have a circular, oblong, or substantially circular cross section. The via may or may not have a circular cross-section. Although not depicted in FIG. 9BB, the upper contact line 121 and the lower contact line 122 may be present on the top and bottom ends of the cell 120.

The exemplary cell 120 includes an inert electrode 10, a metal oxide layer 15, and an inner (top) electrode 20. The inert electrode 10 includes a bottom portion and vertical portions that extend upwardly from the bottom portion thereof. The vertical portions of the inert electrode terminate beneath the plane including the top opening of the via 35. The metal oxide layer 15 provides a filament forming layer for the memory device and is in direct contact with the inert electrode 10 and the inner electrode 20. The metal oxide layer 15 is physically separated from the lower contact line by the inert electrode 10. Portions of the metal oxide layer 15 extend over the top surfaces of the inert electrode 10. The inner electrode 20 is electrically connected to the upper contact line. The inert electrode 10 is electrically connected to the lower contact line and may be in direct contact therewith. In some embodiments (not shown), the bottom (horizontal) portion of the inert electrode is omitted.

The metal oxide layer 15 includes a top portion that adjoins the sidewall of the via opening 35. It further includes vertical segments and a bottom, horizontal segment that are in direct contact with the inert electrode 10. The inner electrode 20 is in direct contact with the inner sidewall and bottom segment of the metal oxide layer. Switching of the memory device, e.g., via different resistive states, can include electrical characteristics measured from the laterally orientated interaction across the vertical portions of the metal oxide layer 15, e.g., measured from the inert electrode 10 to the inner electrode 20.

The uppermost region of the memory device in which the electrical switching occurs is at the top surface of the inert electrode. As previously indicated, the top surface of the inert electrode 10 is recessed within the via containing the memory device. Accordingly, the portion of the memory device where switching occurs is separated from the portions of the memory device where damage can occur from top planarization or etch of the ILD layer 125 and the cell 120.

Area modulation of the resistive random access memory cell 120 in the vertical direction at a given cross-bar pitch is possible. In some embodiments the metal oxide layer 15 can be thinned to reduce the operating voltage. In some embodiments, the active oxide area, by scaling of the vertically orientated portions of the metal oxide layer 15, can be tuned to ensure deterministic filament formation at a small pitch.

The inert electrode 10 of the exemplary cell is deposited on sidewalls of the via 35 and may be in direct contact with the lower contact line. In some embodiments, the inert electrode 10 is an electrically conductive, metal-containing composition selected from the group consisting of ruthenium (Ru), titanium nitride (TiN), tungsten (W), tantalum nitride (TaN) and combinations thereof. The thickness of the inert electrode 10 may range between one nanometer and fifty nanometers (1-50 nm). In one example, the inert electrode 10 is composed of titanium nitride (TiN) having a thickness ranging from 10 nm to 50 nm. In another example, the inert electrode 10 is a titanium nitride (TiN) layer having a thickness ranging from 5 nm to 10 nm. The inert electrode 10 is a contiguous structure including the vertically orientated portions and the horizontally orientated portions as shown in the cross-sectional view of FIG. 9B, and has a U-shaped cross-sectional geometry.

In some embodiments, the inert electrode 10 may be formed by blanket deposition of an electrically conductive material layer on the sidewall of the via 35 and on the lower contact line 122 by atomic layer deposition (ALD). A portion of the blanket layer is also formed on the upper surface of the interlevel dielectric layer 125 outside of the via 35. The inert electrode may be deposited by atomic layer deposition (ALD) using subsequent pulses of $TiCl_4$ and $NH_3$ at temperatures above 350° C. The remainder of the via opening 35 is filled with an organic planarization layer (OPL) (not shown). The organic planarization layer is recessed and the portion of the blanket layer exposed by recessing the organic planarization layer is removed. For example, if the organic planarization layer overfills the via 35, a chemical mechanical planarization (CMP) process may be first employed to remove the excess. Thereafter, the organic planarization layer may be etched to a depth that exposes the portion of the blanket layer to be removed. The etch process may be a wet chemical etch, or a dry etch, such as a reactive ion etch (ME). In some embodiments, the organic planarization layer is recessed to a depth that exposes enough of the blanket layer so that the metal oxide layer 15 can encapsulate the upper portion of the inert electrode 10, thereby physically and electrically separating it from the later-formed upper contact line 101. Following recessing of the organic planarization layer, the exposed portions of the blanket layer for the inert electrode 10 are removed by a selective etch process. As used herein, the term "selective" in reference to a material removal process denotes that the rate of material removal for a first material, e.g., the blanket layer for the inert electrode 10, is greater (and preferably much greater) than the rate of removal for at least another material, e.g., the dielectric layer 125 and/or the organic planarization layer. In one embodiment, a wet etch is employed to remove the exposed portion of the blanket layer. Wet etch chemistry including hydrogen peroxide can remove the exposed portion of the inert electrode, which in some embodiments can be composed of titanium nitride (TiN), selectively to the organic planarization layer. In other embodiments, a reactive ion etch (RIE) is employed to remove the exposed portion of the blanket layer used to form the inert electrode 10. A reactive ion etch (ME) chemistry composed of $Ar/Cl_2$ can remove the exposed portion of the inert electrode in embodiments wherein titanium nitride (TiN) forms the blanket layer. The organic planarization layer is then removed.

Still referring to FIG. 9BB, the metal oxide layer 15 in the exemplary cell 120 is a conformal layer having vertically orientated and horizontally orientated portions. The vertically orientated portions of the metal oxide layer 15 are in direct contact with the inner vertical sidewalls of the inert electrode 1. The horizontally orientated portion of the metal oxide layer 15 is in direct contact with the horizontal segment of the inert electrode. In some embodiments, the metal oxide layer 15 is composed of graded metal oxide(s) including sub-stoichiometric regions including oxygen and impurity gradients. Hafnium oxide ($HfO_2$), tantalum oxide ($Ta_2O_5$), titanium oxide ($TiO_2$), tungsten oxide ($WO_3$), zirconium oxide ($ZrO_2$), aluminum oxide ($Al_2O_3$), strontium titanium oxide ($SrTiO_3$) are exemplary stoichiometric metal oxide compounds. A similar structure is described in commonly assigned U.S. Pat. No. 10,361,368 B2. However, the metal oxide layer of the memory device disclosed in the patent does not include the sub-stoichiometric region(s) containing the oxygen/impurities concentrations resulting from use of a thermal ALD process as described below with respect to FIGS. 1-8.

In accordance with the invention, the metal oxide layer includes one or more sub-stoichiometric regions deposited using an atomic layer deposition (ALD) process such as the process described below with reference to FIGS. 1-8. In an exemplary embodiment including a hafnium oxide layer as a filament forming layer, the sub-stoichiometric (metal rich) region(s) of the metal oxide layer would comprise $HfO_x$ wherein x is less than 2. In a further exemplary embodiment including a tantalum oxide layer, the metal oxide layer could comprise sub-stoichiometric $Ta_2O_x$ wherein x is less than 5 or $TaO_x$ wherein x is less than 2. The metal oxide layer 15 may have a thickness in the range of 1 nm to 15 nm. In one example, the metal oxide layer is composed of hafnium oxide and has a thickness in the range of 3 nm to 10 nm. In another example, the metal oxide layer 15 is a tantalum oxide layer having a thickness in the range of 3 nm to 10 nm. The conformal metal oxide layer 15 is continuous from the vertically orientated portions to the horizontally orientated portions, which as viewed in cross-section as illustrated in FIG. 9BB has a U-shaped geometry.

The metal oxide layer 15 comprises a single metal oxide or multiple metal oxides deposited by atomic layer deposition. In embodiments including two adjoining metal oxide layers, one or both of the layers may include a graded lateral oxygen profile with a mirrored impurity (reaction byproduct) profile. Sub-stoichiometric regions of the metal oxide layer(s) may be provided near one vertical interface, near both vertical interfaces or near the center of the layer(s).

Various precursors of a selected metal and various ligands may be employed in the ALD process of forming the metal oxide layer 15. The impurities contained within the metal oxide layer are obtained from the ligands. A hybrid mixed precursor ALD method is employed to deposit the graded sub-stoichiometric oxide layer (the vacancy source for the RRAM) in conjunction with optional stoichiometric oxide for property tuning. The substrate is exposed to alternating pulses of metal precursor M1 with two different ligands La and Lb. In some embodiments, one ligand is a metal-organic ligand while the other ligand is a halide. The following exemplary sequence is employed in some embodiments: M1La→purge→M1Lb→purge→oxidizer→purge (tune super-cycle). The sequence may be repeated until a metal oxide layer of desired thickness and electrical properties is obtained. In some embodiments, M1 is hafnium (Hf), La is chlorine ($Cl_4$) and Lb is $[(CH_3)(C_2H_5)N]4$. The layer formed using such a method includes one or more regions that are sub-stoichiometric. Such regions will have a correspondingly higher density of reaction byproducts (for example, C, H, N, Cl). An optional stoichiometric layer can be formed using standard thermal ALD with M2Lc (where M2 may or may not be the same as M1). Further description of an exemplary ALD process for forming the metal oxide layer 15 is provided in commonly assigned U.S. patent application Ser. No. 16/516,423 filed Jul. 19, 2019, which is incorporated by reference herein. The description below with respect to the exemplary process depicted in FIGS. 1-8 also includes a detailed description of an exemplary ALD process of forming the metal oxide layer 15 having one or more sub-stoichiometric regions (and corresponding impurity regions) without the need for using a scavenging electrode.

The inner electrode 20 may be deposited as a conformal layer on the inner surfaces of the conformal, ALD-graded metal oxide layer 15. The inner electrode 20 is in direct contact with a top contact line of the cross-bar architecture. A metal containing composition selected from the group consisting of titanium nitride (TiN), tantalum nitride (TaN), (M)AlC, where M is a transition metal selected from the group consisting of Ti, Ta, and Nb, and combinations thereof, may comprise the electrode 20. In some embodiments, the inner electrode 20 is a single material layer. Alternatively, the electrode 20 may be a multi-layered stack. In some embodiments, the inner electrode 20 may have a thickness in the range of one to seventy nanometers (1-70 nm). In one exemplary embodiment, the inner electrode 20 includes a titanium (Ti) rich titanium nitride (TiN) layer and a titanium aluminum carbon layer (e.g., (Ti)AlC). In one example, the inner electrode 20 and/or selector includes a first titanium nitride (TiN) layer having a thickness ranging from 0.3 nm to 3 nm that is in direct contact with the metal oxide layer 15, a titanium aluminum carbon (TiAlC) layer having a thickness ranging from 1 nm to 5 nm that is in direct contact with the first titanium nitride (TiN) layer, and a second titanium nitride (TiN) layer having a thickness ranging from 10 nm to 50 nm that is in direct contact with the titanium aluminum carbon (TiAlC) layer. As the inner electrode 20 is not relied on as an oxygen scavenger, the choice of electrically conductive electrode materials is enhanced.

A metal fill layer 25 fills the remainder of the via opening 35. The metal fill layer 25 is composed of an electrically conductive material and is substantially centrally positioned within the via 35. For example, the fill metal may be composed of aluminum (Al), copper (Cu), gold (Au), platinum (Pt), silver (Ag), tantalum (Ta), titanium (Ti), tungsten (W) and combinations and alloys thereof. In some examples, a nitride fill metal, e.g., titanium nitride (TiN), tantalum nitride (TaN), tungsten nitride and/or (WN) may be employed. The metal fill layer 25 is optional and in some embodiments may be omitted. The metal fill layer 25 may be deposited using physical vapor deposition (PVD), e.g., sputtering; plating, e.g., electroplating and/or electroless plating, chemical vapor deposition, atomic layer deposition (ALD), or a combination thereof.

In some embodiments, the top surfaces of the metal fill layer 25, the inner electrode 20, and the metal oxide layer 15 may be coplanar to each other as well as being coplanar with the top surface of the interlevel dielectric layer 125. Such a structure may be obtained by planarization to remove the portions of the metal fill 25, the metal oxide layer 15 and the reactive electrode 20 that extend outside the via opening 35 and may be present over the upper surface of the dielectric layer 125. The planarization process may include chemical mechanical planarization (CMP), a reactive ion etching process (RIE), or a combination thereof to isolate the cell, expose the dielectric layer 125, and expose the electrode 20 and gap fill 25 as depicted in FIG. 9B for subsequent electrical connection to the top metal line 121 as depicted in FIG. 9A. The top metal contact line 101 may be formed in direct contact with the planarized surface of the random access memory (RRAM) cell. The upper contact line 121 may be formed by depositing a dielectric layer, forming a line trench in the dielectric layer to expose the planarized surface of the random access memory (RRAM) cell, and depositing an electrically conductive material within the line trench.

The top surfaces of the metal fill layer 25, the inner electrode 20, and the metal oxide layer 15 may be in direct contact with the upper contact line 121 that is depicted in FIG. 9A. In some alternative embodiments of the cell (not shown), fill metal comprises the inner electrode. The fill metal in such alternative embodiments may be, for example, selected from the group consisting of titanium nitride (TiN), tantalum nitride (TaN), (M)AlC, where M is a transition metal selected from the group consisting of Ti, Ta, and Nb, and combinations thereof. As discussed above, scavenging properties are not required of the electrically conductive material adjoining the metal oxide layer 15. Accordingly, the electrodes contacting the metal oxide layer can be inert with respect to the metal oxide layer.

FIGS. 9A and 9B include top plan and cross-sectional views of an exemplary resistive random access memory (RRAM) cell having a laterally switching cell structure. The cell can define part of a MIM structure (e.g., planar X-point or stacked 3D RRAM). The exemplary structure 900 includes a via that extends vertically through an ILD layer. A conformal metal oxide layer 904 including sub-stoichiometric region(s) adjoins the sidewall of the via. In some embodiments of the invention, the sub-stoichiometric ALD metal-oxide layer is formed by sequentially using "X" (M1La-M1Lb-O) cycles, "Y" (M1La-M1Lb) cycles, and "Z" (M1La/M1Lb-O) cycles of a super-cycle X-Y-Z, as discussed later herein.

A vertical electrode 906 fills the remainder of the via and adjoins the inner sidewall of the conformal metal oxide layer 904. The vertical electrode in this embodiment is not a conformal layer. A metal contact line 902 is electrically connected to the vertical electrode. A plurality of parallel, plate-like electrodes extend horizontally with respect to the vertical electrode. The horizontal electrodes have inner ends in direct contact with the outer surface of the metal oxide layer 904. Dielectric layers are positioned in alternating sequence with the horizontal electrodes.

Figure 13A:
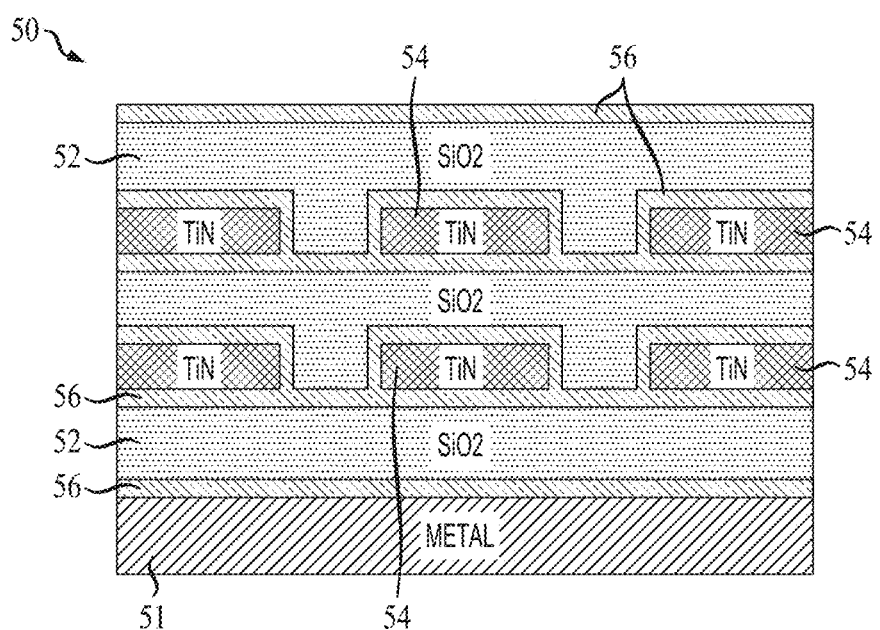
FIG. 13A is a cross-sectional view schematically illustrates a structure obtained during the fabrication of an array of exemplary RRAM devices.

FIGS. 13A-13DD illustrate selected stages of a process flow for forming arrays of cell structures, each including a sub-stoichiometric active layer deposited by atomic layer deposition. Referring first to FIG. 13A, a multilayer structure 50 is obtained by sequentially depositing silicon nitride, titanium nitride and silicon nitride layers 56, 54, 56 on silicon dioxide layers 52. A metal layer 51 comprises the base of the structure 50. It will be appreciated that materials other than those specifically indicated may be employed in forming the structure 50. Patterning of the deposited silicon nitride and titanium nitride layers allows the formation of discrete regions of the titanium nitride layers, the titanium nitride regions being encapsulated by silicon nitride. The discrete titanium nitride regions in each layer are vertically aligned with such regions in other layers.

There are numerous techniques used by those skilled in the art to remove material at various stages of creating a multilayer structure such as the structure 50. Patterning of the layers may include the application and patterning of masks, wet etching, dry etching, chemical oxide removal (COR) etching, and/or reactive ion etching (RIE), which are all known techniques to remove select material when forming an electronic structure. The techniques for patterning multilayer structures including dielectric and metal layers are well understood by those skilled in the art and, as such, a more detailed description of such processes is not presented herein.

Figure 13B:
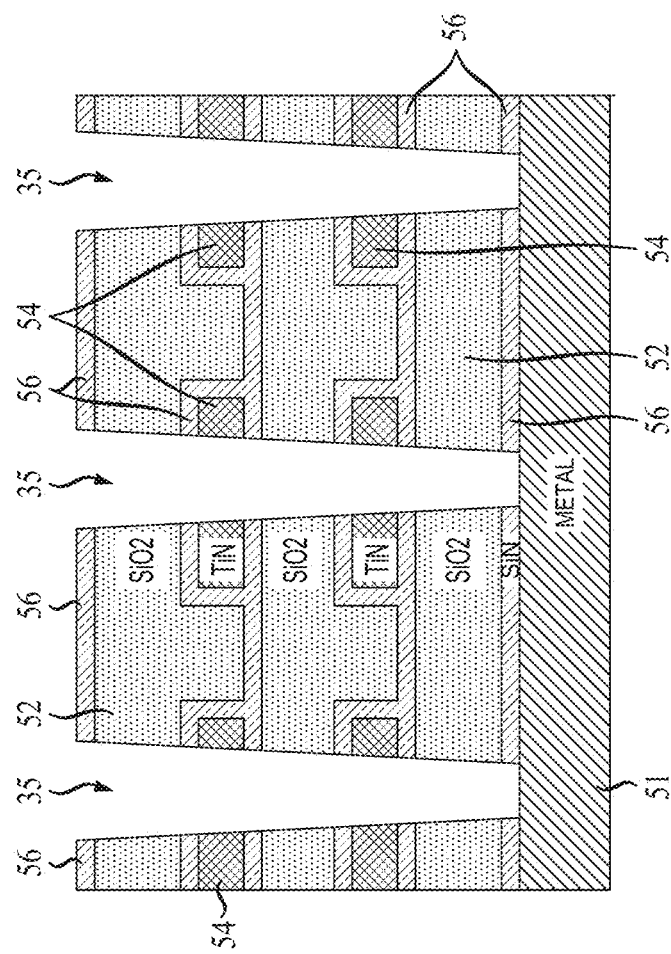
FIG. 13B is a top plan view schematically illustrating the structure shown in FIG. 13A following via formation.
Figure 13B:
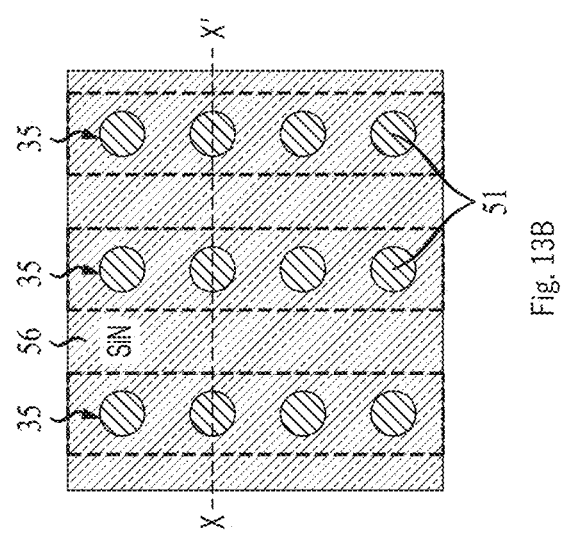

Vertical vias 35 are formed in the multilayer structure 50 down to the metal layer 51 to obtain a structure as schematically illustrated in FIGS. 13B and 13BB. Reactive ion etching or other suitable etch process or sequence of etch processes may be employed. The vias 35 extend vertically through each of the discrete regions of the titanium nitride layers 54. Opposing portions of each of the discrete titanium regions adjoin each via and are later functional as electrodes.

A conformal metal oxide layer 904 is formed on the structure and covers the sidewalls of the vias 35 as well as the top surfaces of the structure. Deposition of the metal oxide layer 904 is followed by deposition of an electrically conductive layer 58 that is later configured as electrodes. The metal oxide layer is deposited using an atomic layer deposition process that allows sub-stoichiometric regions to be formed therein, even without the use of scavenging electrodes. As discussed above, the sub-stoichiometric region(s) contain a correspondingly higher density of reaction byproducts. Various lateral oxygen/impurity gradients can be obtained in the metal oxide layer. The electrically conductive layer 58, for example a titanium nitride (TiN) layer, can be deposited as a conformal layer directly on the metal oxide layer using atomic layer deposition. An exemplary structure including a conformal metal oxide layer and an electrically conductive layer 58 is schematically illustrated in FIG. 13C.

Figure 13C:
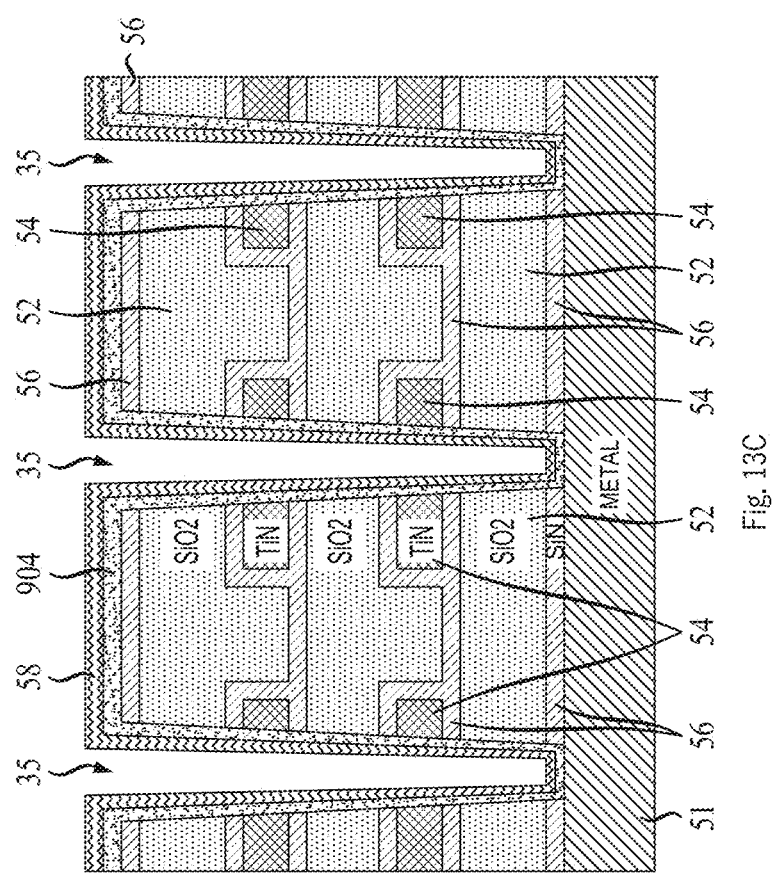
FIG. 13C is a cross-sectional view thereof following deposition of conformal electrode and graded metal oxide layers.

A fully thermal ALD technique for forming the metal oxide layer 904 as shown in FIG. 13C includes M1La-M1Lb-O ALD cycles and (M1La-M1Lb-O).x+(M1La-M1Lb).y ALD super-cycles, where x and y can be arbitrarily repeated any number of times (i.e., x and y can each be 0, 1, 2, 3, 4, 5 . . . 10 . . . N, and x and y can have the same or a different value). In some embodiments of the invention, the (M1La-M1Lb-O).x and (M1La-M1Lb).y cycles are sub-stoichiometric ALD cycles. A "fully thermal" ALD process refers to a process where no plasma is introduced during the ALD cycle. By avoiding the use of plasmas, a complete, conformal, uniform film deposition is possible. The ALD process is conducted at or below 400° C.

In some embodiments of the invention, the ALD super-cycles are further modified to include a set of stoichiometric ALD cycles z after the sub-stoichiometric ALD cycles x and y. For example, (M1La-M1Lb-O).x+(M1La-M1Lb).y+(M1La or M1Lb).z ALD super-cycles, wherein z can also be arbitrarily repeated any number of times (i.e., x, y, and z can each be 0, 1, 2, 3, 4, 5 . . . 10 . . . N, and x, y, and z can have the same or different values). In some embodiments of the invention, the ALD cycles of the super-cycle can be arbitrarily reordered (aka, the first pulse, second pulse, and oxidant pulse can occur in any desired order).

ALD techniques in accordance with aspects of the invention can provide for the full coverage of a self-saturated M1La layer, followed by the full coverage of an M1Lb layer following the La-Lb reactions and the degassing of by-products. In some embodiments of the invention, the self-saturated M1La layer and the M1Lb layer define a bilayer. The stoichiometry of a film formed according to one or more embodiments can be tuned by modifying the intervening oxidants (e.g., $O_2$, $H_2O$, $O_3$, NO, $N_2O$, etc.) and/or by tuning the ALD cycles x, y, and z in the ALD super-cycle (x,y or x,y,z).

Benefits of this technique over prior ALD processes include the ability to form conformal and uniform sub-stoichiometric metal oxide materials without need for scavenging electrodes, composition tuning, and grading by modifying the x,y,z cycles of the super-cycle sequence. ALD techniques in accordance with aspects of the invention are front-end-of-line (FEOL) compatible due to the lack of need for plasma processes. Assuming M1La and M1Lb are the precursors used together with an oxidant O to form the metal oxide MOx, in one embodiment a graded conformal layer consists of a diffused stack of three (3) sub-layers. The first is highly sub-stoichiometric and obtained by successive pulses of the metal precursors without an oxidant; this sub-layer has a high concentration of by-products. The second sub-layer has an intermediate oxygen content and is obtained from the M1La, M1Lb, O repeated sequence; this sub-layer has an intermediate concentration of by-products. The third sub-layer is stoichiometric, with little trace of by-products and obtained from the repeated standard oxidation cycles M1La, O.

The present ALD technique has a wide range of practical applications, such as in metal-insulator-metal (MIM) stacks, 3D memory oxides, 3D flash devices, resistive random access memory (RRAM), or in high-k dielectric films, such as those used in FETs and MIMCAPs. For example, this process can be used to build a MIM stack having a metal sub-oxide (e.g. $HfO_2$, or $Ta_2O_{5-x}$, or $TaO_{2-x}$) positioned between a top and bottom electrode (e.g., TiN). The metal sub-oxide can contain significant traces of N, Cl, C, H (by-products of ALD reactions) and M1-M1 metallic bonds. Moreover, the metal sub-oxide can be conformal (self-limited reactions and formed at or below 400° C. with no use of plasma, thereby allowing use in forming high-aspect-ratio structures in back-end-of-line (BEOL) operations). RRAM devices formed using this process can have lowered forming, set, and/or reset voltages.

Turning now to a more detailed description of aspects of the present invention, FIGS. 1-8 depict cross-sectional views of a portion of a semiconductor wafer/structure 100 after fabrication operations for forming a sub-stoichiometric metal-oxide stack (shown in FIG. 8) from an ALD process using (M1La-M1Lb-O).x+(M1La-M1Lb).y+(M1La or M1Lb).z ALD super-cycles according to embodiments of the invention. More specifically, FIG. 1 depicts a cross-sectional view illustrating three instances of an initial wafer/structure/substrate 102 that results from performing initial fabrication operations in accordance with embodiments of this invention.

As shown in FIG. 1, a surface of the substrate 102 is exposed to a first precursor M1La to form a first ALD layer 104 during a first pulse of an ALD cycle. In some embodiments of the invention, the first ALD layer 104 includes the chemisorbed metal 106 of the first precursor M1La and its remaining ligands. In some embodiments of the invention, the first pulse results in the deposition of a single layer of the chemisorbed metal 106. In some embodiments of the invention, the first pulse is tuned (e.g., by modifying the pulse duration based on the selected precursor) to ensure that the surface of the substrate 102 is fully saturated (i.e., self-saturated) by the chemisorbed metal 106 (middle image). In some embodiments of the invention, formation of the first ALD layer 104 results in the substrate 102 having a coated surface terminated by the first precursor ligands La.

The first precursor M1La can include a metal (M1) and a ligand (La). The metal can include any suitable material, such as, for example, Hf, Ta, Zr, Al, La, Si, etc. The ligand can include any suitable material, such as, for example, halides, a chloride ($Cl_4$ or $Ck_3$), or a metalorganic (trimethyl metalorganics, tetramethylethyl metalorganic, etc., such as $Al_2(CH_3)_6$).

While not illustrated for ease of discussion, in some embodiments of the invention, the first pulse (and in fact, any of the pulses, including all precursor and oxidant pulses) is followed by a non-reactive purge pulse. The purge pulse does not affect the final chemistry, and a detailed discussion of the purge pulses is omitted for simplicity. The purge pulses can include, for example, N2, Ar, He, vacuum, etc., and can be used to purge off-gasses and unreacted precursor gasses. All process steps can be conducted at 400° C. or below without the need for a plasma, thereby allowing their use in high aspect ratio structures or features during BEOL processing.

As further shown in FIG. 1, the surface of the first ALD layer 104 is exposed to a second precursor M1Lb to form a second ALD layer 108 during a second pulse of an ALD cycle. In some embodiments of the invention, the second precursor M1Lb includes a same metal (M1) as the first precursor M1La. In some embodiments of the invention, the second precursor M1Lb includes a same metal (M1) but a different ligand (Lb) as the first precursor M1La.

In some embodiments of the invention, the different ligands La and Lb correspond to distinct halides and metal-organic ligands, including amines and carbo-hydrates. In some embodiments of the invention, the first ligand La and the second ligand Lb are selected from a same class of ligands (e.g., both are halides, metalorganics, etc.). In some embodiments of the invention, the first ligand La is selected from a first class of ligands (e.g., a halide) and the second ligand Lb is selected from a second class of ligands (e.g., a metalorganic). For example, the metal M1 can be hafnium (Hf) and the different precursors can include a combination of $HfCl_4$, TEMAHf, and TDMAHf, etc., depending on the application. In another example, the metal M1 corresponds to tantalum (Ta) and the different precursors include a combination of $TaCl_5$, poly(2,5-dimethoxyaniline) tantalum (PDMAT), or n-terbutylim mido-tris(diethylamino) tantalum (TBTDET).

In some embodiments of the invention, the first ligand La of the first precursor M1La reacts with the second ligand Lb of the second precursor M1Lb during the second pulse. In some embodiments of the invention, the reacted ligands La and Lb form an off-gas that is removed from the semiconductor structure 100. In some embodiments of the invention, what remains in the first ALD layer 104 after off-gassing is the metal M1 and some residuals (unreacted ligands and reaction by-products such as N, Cl, C, H).

In some embodiments of the invention, the second ALD layer 108 includes the chemisorbed metal 110 of the second precursor M1Lb and its remaining ligands. In some embodiments of the invention, the second pulse results in the deposition of a single layer of the chemisorbed metal 110. In some embodiments of the invention, the chemisorbed metal 110 of the second precursor chemisorbs, during the second pulse, onto the coated surface of the substrate 102 terminated by the first precursor ligands La.

The second pulse may be tuned (e.g., by modifying the pulse duration based on the selected precursor) to ensure that the surface of the first ALD layer 104 is fully saturated (i.e., self-saturated) by the chemisorbed metal 110 (bottommost image). In some embodiments of the invention, the first ALD layer 104 and the second ALD layer 108 form a single ALD bilayer 104/108. By building the stack layer by layer in this manner, the overall ALD process can be readily fine-tuned to meet a wide variety of process (composition, thickness, etc.) requirements.

Figure 2:
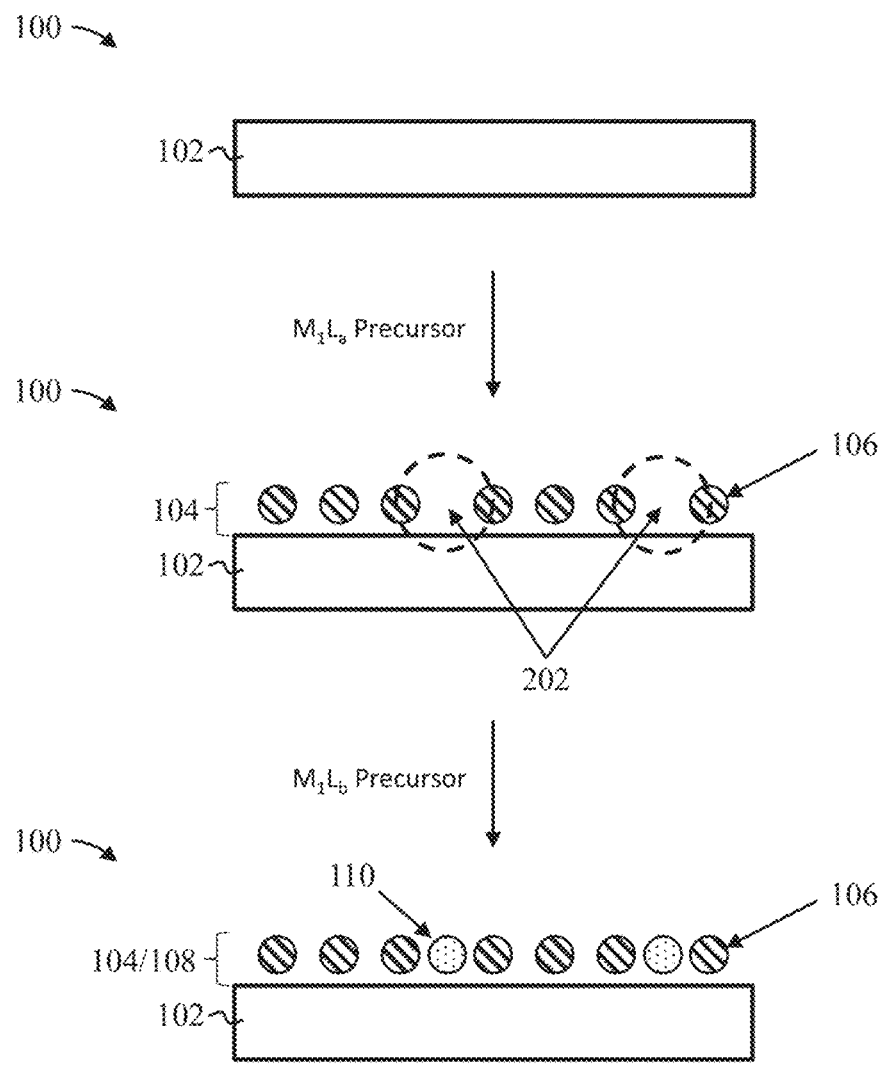
FIG. 2 depicts a cross-sectional view of the structure after fabrication operations in accordance with embodiments of the invention.

FIG. 2 depicts a cross-sectional view illustrating three instances of the semiconductor structure 100 after a processing operation according to one or more embodiments of the invention. While FIG. 1 illustrates the primary mechanism for the incorporation of metal during second M1Lb cycle (i.e., whereby the metal 110 chemisorbs onto the coated surface of the substrate 102 terminated by the first precursor ligands La), a second mechanism is possible. In some embodiments of the invention, the first precursor M1La and its remaining ligands can block some, but not all, of the adsorption/reaction sites (middle image). In some embodiments of the invention, one or more adsorption sites 202 remain open on the surface of the substrate 102.

As illustrated in FIG. 2, the surface of the substrate 102 is exposed to the second precursor M1Lb to fill in any (some, or all) of the one or more adsorption sites 202 in the first ALD layer 104 during a second pulse of an ALD cycle (bottommost image). In some embodiments of the invention, the second pulse immediately follows the first pulse.

By performing the second pulse right after the first pulse (i.e., by exposing the substrate 102 directly to the second precursor M1Lb without an oxidant pulse), the M1Lb uptake will be self-limited to the available reaction sites (e.g., the one or more open adsorption sites 202). In this manner, the first ALD layer 104 can be formed sub-stoichiometrically. In some embodiments of the invention, the chemisorbed metal 110 of the second precursor M1Lb reacts with the chemisorbed metal 106 of the first precursor M1La. In other words, the first ALD layer 104 can be a sub-oxide having M1-M1 metallic bonds. In some embodiments, the first ALD layer 104 can also include (in addition to M1-M1 metallic bonds) one or more of M1-C and M1-N bonds from precursor reaction by-products. The metal 110 chemisorbs via a combination of both the primary (chemisorb to the coated surface terminated by the first precursor ligands) and secondary mechanisms (chemisorb to open sites after the first pulse) in one or more embodiments.

Figure 3:
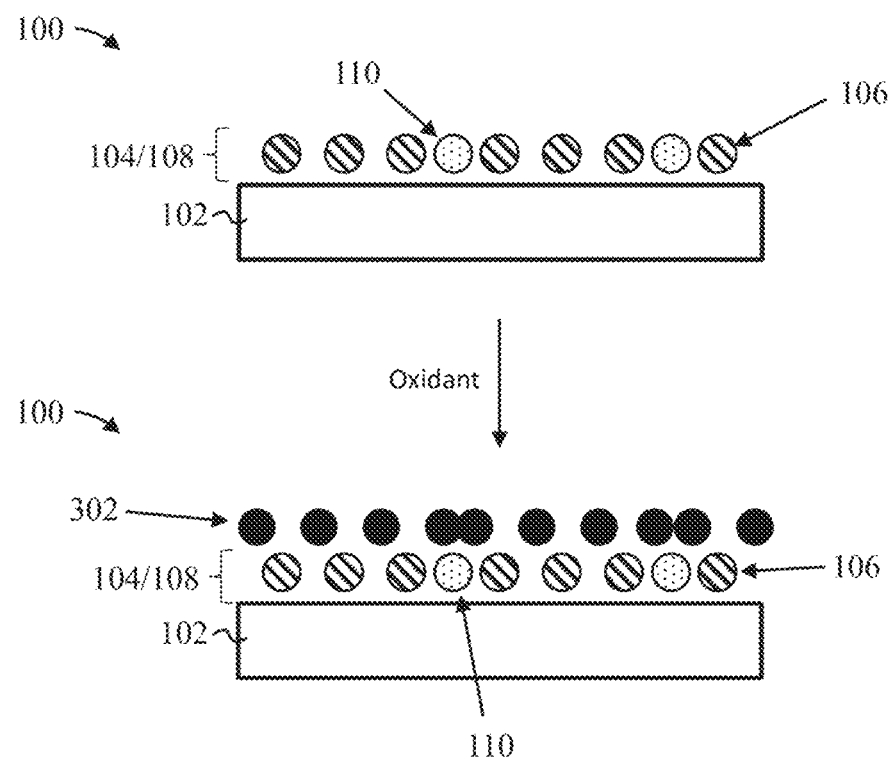
FIG. 3 depicts a cross-sectional view of the structure after fabrication operations in accordance with embodiments of the invention.

FIG. 3 depicts a cross-sectional view illustrating two instances of the semiconductor structure 100 after a processing operation according to one or more embodiments of the invention. As illustrated in FIG. 3, the surface of the first ALD layer 104 and the second ALD layer 108 (or bilayer 104/108, depending on how the second metal chemisorbs, discussed previously) is exposed to a thermal oxidant (O) during an oxidant pulse of the ALD cycle. In some embodiments of the invention, the thermal oxidant O can include, for example, $H_2O$, $N_2O$, $NO$, $O_3$, $O_2$, etc. In some embodiments of the invention, the oxidant pulse results in a single oxidant layer 302 forming on a surface of the first ALD layer 104 (bottom image).

Figure 4:
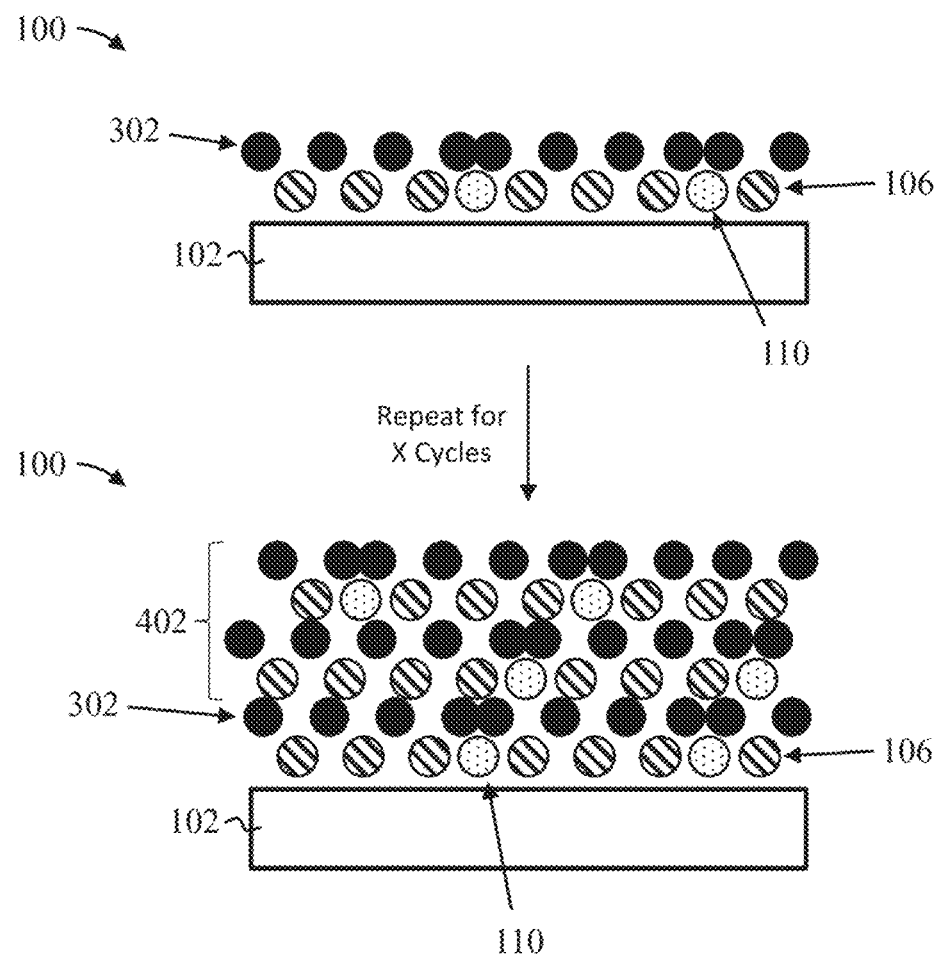
FIG. 4 depicts a cross-sectional view of the structure after fabrication operations in accordance with embodiments of the invention.

FIG. 4 depicts a cross-sectional view illustrating two instances of the semiconductor structure 100 after a processing operation according to one or more embodiments of the invention. As illustrated in FIG. 4, the semiconductor structure 100 is exposed to "X" repeated cycles of the ALD pulse (M1La-M1Lb-O) depicted in FIGS. 1-3 to build sub-stoichiometric layers 402 (bottom image).

In some embodiments of the invention, the sub-stoichiometric layers 402 are built by sequentially exposing the surface of the substrate 102 to: (1) a pulse of the first precursor M1La to form an ALD layer (as described with respect to FIG. 1); (2) a pulse of the second precursor M1Lb to fill in any (some, or all) of one or more adsorption sites in the ALD layer (as described with respect to FIG. 2); (3) a thermal oxidant pulse (as described with respect to FIG. 3); and (4) repeating as needed. The sub-stoichiometric layers 402 can be formed to any arbitrary thickness by increasing the number "X" of the repeated M1La-M1Lb-O cycles as desired.

Figure 5:
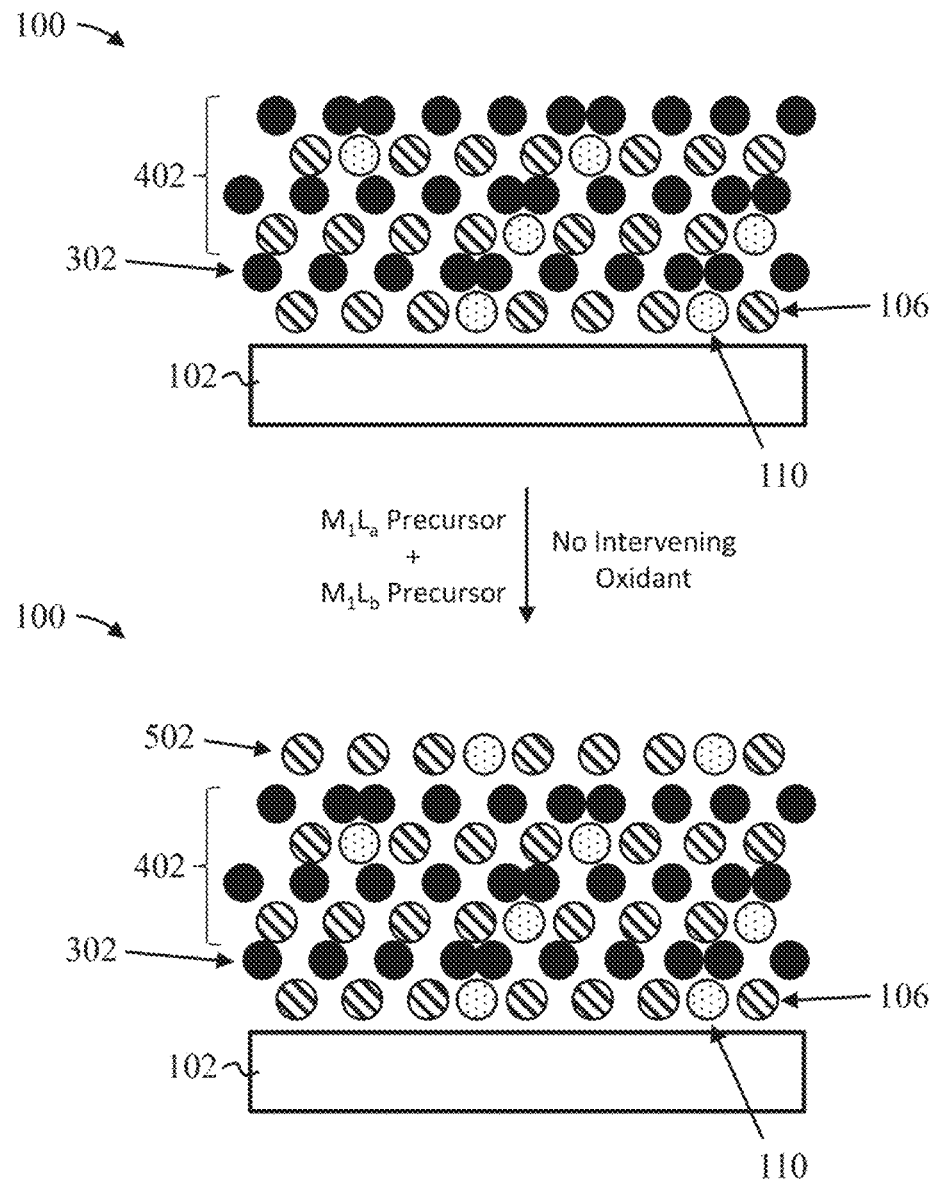
FIG. 5 depicts a cross-sectional view of the structure after fabrication operations in accordance with embodiments of the invention.

FIG. 5 depicts a cross-sectional view illustrating two instances of the semiconductor structure 100 after a processing operation according to one or more embodiments of the invention. In some embodiments of the invention, the ALD pulses (M1La-M1Lb-O).x are followed by a second ALD pulse without thermal oxidant pulses (i.e., M1La-M1Lb cycles). As illustrated in FIG. 5, during the second ALD pulse the semiconductor structure 100 is sequentially exposed to the first precursor and the second precursor to form a sub-stoichiometric layer 502 (bottom image).

Figure 6:
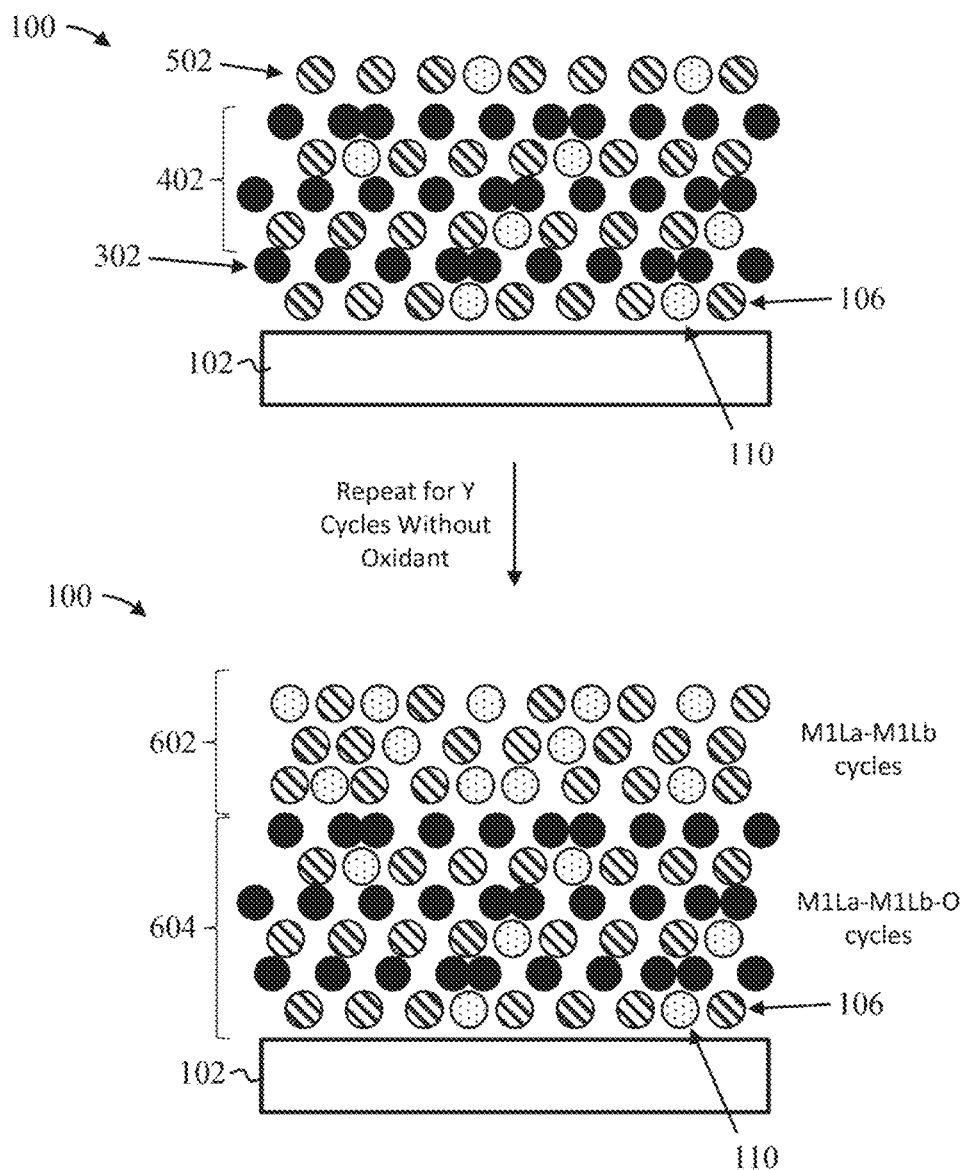
FIG. 6 depicts a cross-sectional view of the structure after fabrication operations in accordance with embodiments of the invention.

FIG. 6 depicts a cross-sectional view illustrating two instances of the semiconductor structure 100 after a processing operation according to one or more embodiments of the invention. As illustrated in FIG. 6, the semiconductor structure 100 is optionally exposed to "Y" repeated cycles of the ALD pulse (M1La-M1Lb) depicted in FIG. 5 to build additional sub-stoichiometric layers over the sub-stoichiometric layer 502, defining the sub-stoichiometric layers 602 (bottom image). As further shown in FIG. 6, the first ALD layer, the single oxidant layer 302, and the sub-stoichiometric layers 402 define a first set of sub-stoichiometric layers 604 under the sub-stoichiometric layers 602.

In some embodiments of the invention, the sub-stoichiometric layers 602 are built by sequentially exposing the surface of the substrate 102 to: (1) a pulse of the first precursor M1La to form an ALD layer (as described with respect to FIG. 1); (2) a pulse of the second precursor M1Lb to fill in any (some, or all) of one or more adsorption sites in the ALD layer (as described with respect to FIG. 2); and (3) repeating as needed (without a thermal oxidant cycle). The sub-stoichiometric layers 602 can be formed to any arbitrary thickness by increasing the number "Y" of the repeated M1La-M1Lb cycles as desired. As can be appreciated from FIG. 6, the ALD pulses (M1La-M1Lb).y differ from the ALD pulses (M1La-M1Lb-O).x due to the lack of the intervening thermal oxidant cycles.

Figure 7:
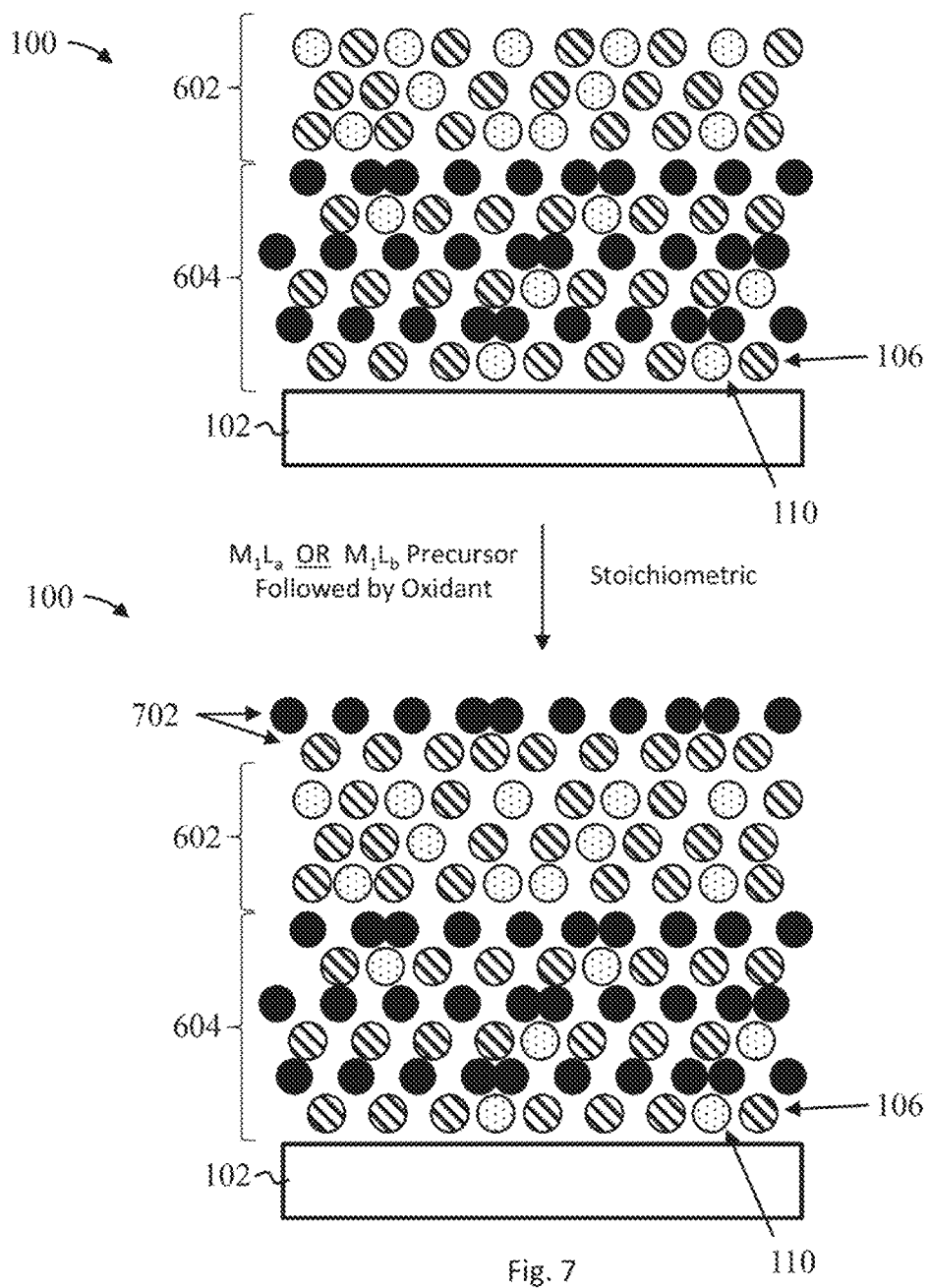
FIG. 7 depicts a cross-sectional view of the structure after fabrication operations in accordance with embodiments of the invention.

FIG. 7 depicts a cross-sectional view illustrating two instances of the semiconductor structure 100 after a processing operation according to one or more embodiments of the invention. As illustrated in FIG. 7, the semiconductor structure 100 is exposed to a third ALD pulse (M1La-O or M1Lb-O) to form one or more stoichiometric layers 702 on the sub-stoichiometric layers 602 (bottom image). In some embodiments of the invention, the third ALD pulse includes M1La pulses followed by O pulses. In some embodiments of the invention, the third ALD pulse includes M1Lb pulses followed by O pulses.

Figure 8:
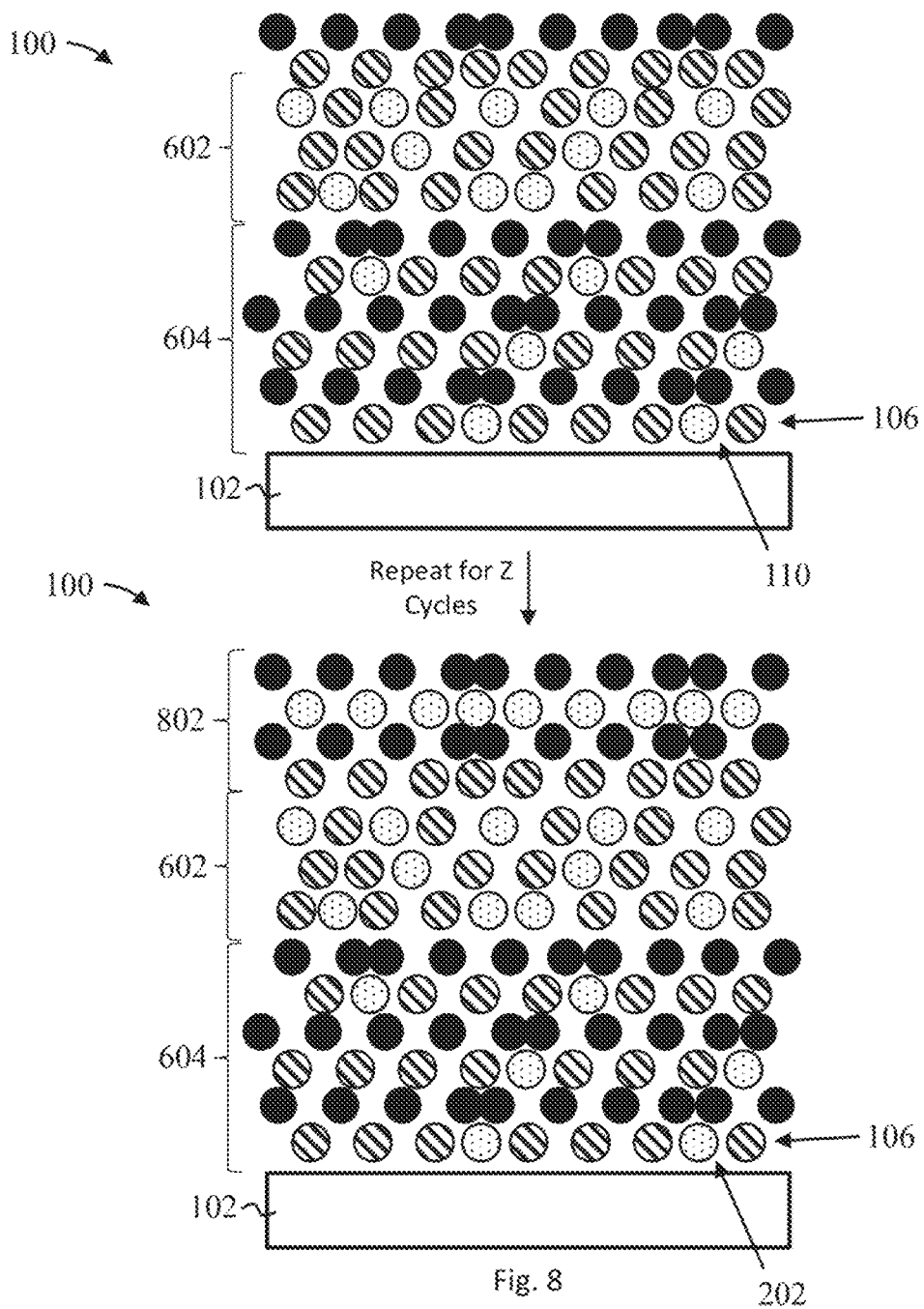
FIG. 8 depicts a cross-sectional view of the structure after fabrication operations in accordance with embodiments of the invention.

FIG. 8 depicts a cross-sectional view illustrating two instances of the semiconductor structure 100 after a processing operation according to one or more embodiments of the invention. As illustrated in FIG. 8, the semiconductor structure 100 is optionally exposed to "Z" repeated cycles of the third ALD pulse (M1La-O or M1Lb-O) depicted in FIG. 7 to build additional stoichiometric layers over the stoichiometric layer 702, defining the stoichiometric layers 802 (bottom image).

In some embodiments of the invention, the stoichiometric layers 802 are built by sequentially exposing the surface of the substrate 102 to: (1) a pulse of the first precursor M1La or the second precursor M1Lb to form an ALD layer; (2) a thermal oxidant pulse (as described with respect to FIG. 3); and (4) repeating as needed. The stoichiometric layers 802 can be formed to any arbitrary thickness by increasing the number "Z" of the repeated M1La/M1Lb-O cycles as desired. As can be appreciated from FIG. 8, the third ALD pulses (M1La/M1Lb-O) differ from the first ALD pulses (M1La-M1Lb-O) as only one of the precursors is included in each layer and differ from the second ALD pulses (M1La-M1Lb) due to the presence of the intervening thermal oxidant cycles.

As illustrated in FIG. 13C, the sub-stoichiometric ALD metal-oxide layer 904 and the electrically conductive (electrode) layer are deposited sequentially. The electrically conductive layer 58 can be formed using known processes. In some embodiments of the invention, the sub-stoichiometric ALD metal-oxide layer 904 is formed according to one or more embodiments of the invention. In some embodiments of the invention, the sub-stoichiometric ALD metal-oxide layer 904 is formed sequentially using "X" (M1La-M1Lb-O) cycles, "Y" (M1La-M1Lb) cycles, and "Z" (M1La/M1Lb-O) cycles of a super-cycle X-Y-Z, as discussed previously herein.

It is understood that the previously described techniques can be incorporated in other processes. Advantageously, this sub-oxide ALD technique can replace or supplement any FEOL or BEOL process whereby oxide films or sub-oxide films are needed (e.g., the high-k dielectric film in FETs, the insulator of a MIMCAP, etc.). In another example, the silicon nitride in a 3D charge-trap flash memory is replaced with an ALD sub-stoichiometric metal-oxide film (e.g., MO—N,C,H,Cl) formed according to one or more embodiments of the invention.

Figure 10:
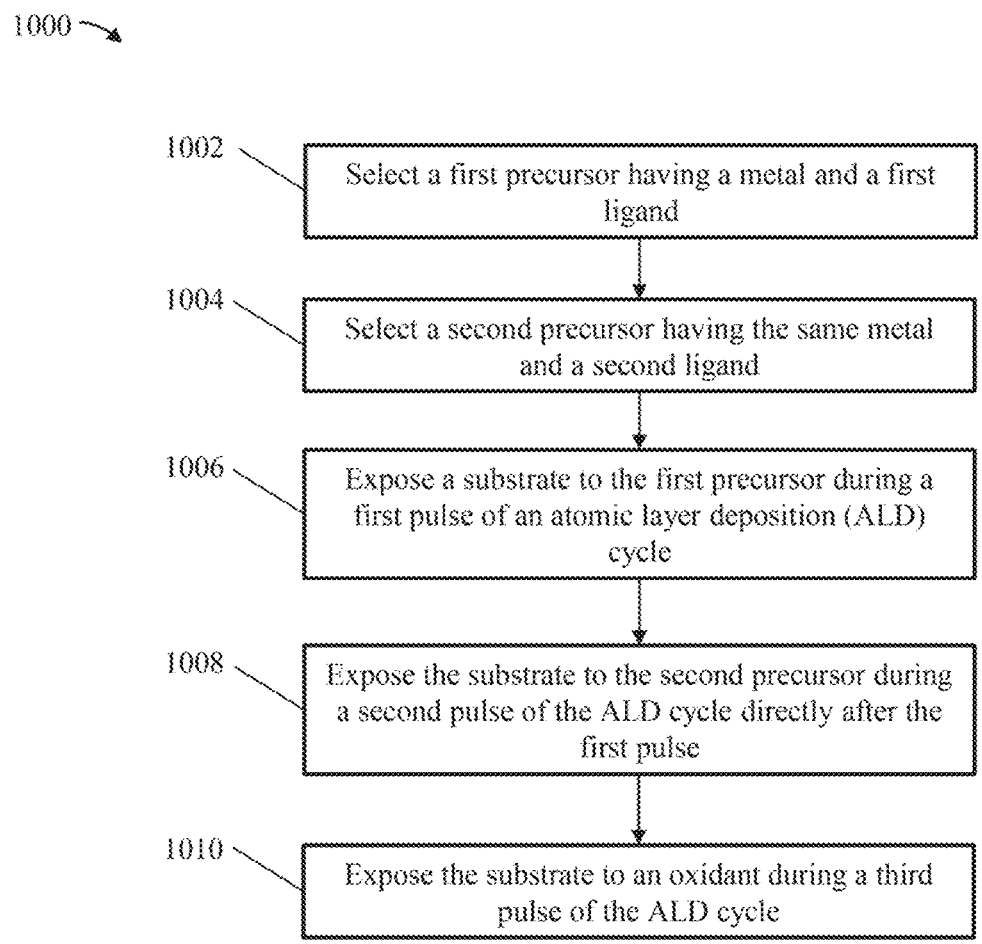
FIG. 10 depicts a flow diagram illustrating a method according to one or more embodiments of the invention.

FIG. 10 depicts a flow diagram 1000 illustrating a method for depositing a sub-stoichiometric metal-oxide according to one or more embodiments of the invention. As shown at block 1002, a first precursor is selected. The first precursor can include a metal and a first ligand. At block 1004, a second precursor is selected. The second precursor can include the same metal and a second ligand. In some embodiments of the invention, the metal includes one or more of Hf, Ta, Zr, Al, La, and Si. While the first ligand and the second ligand could possibly be selected from a same class (e.g., both chlorides), they are selected from different classes in accordance with the preferred embodiments of the invention. In some embodiments of the invention, the first ligand includes a halide and the second ligand includes a metalorganic. In some embodiments of the invention, the first ligand includes a metalorganic and the second ligand includes a halide.

At block 1006, a substrate is exposed to the first precursor during a first pulse of an ALD cycle. In some embodiments of the invention, during the first pulse the metal of the first precursor chemisorbs onto a surface of the substrate. In some embodiments of the invention, one or more adsorption sites remain open after the first pulse.

At block 1008, the substrate is exposed to the second precursor during a second pulse of the ALD cycle. In some embodiments of the invention, the second pulse occurs directly after the first pulse. In some embodiments of the invention, the second pulse occurs after the first pulse such that any intervening pulse is a non-reactive purge pulse (e.g., without an intervening oxidant pulse).

In some embodiments of the invention, during the second pulse the metal of the second precursor chemisorbs onto a coated surface terminated by the first precursor ligands. In some embodiments of the invention, the first ligand and the second ligand react during the second pulse to form one or more by-products. In some embodiments of the invention, at least a portion of the one or more by-products are removed via off-gassing.

At block 1010, the substrate is exposed to an oxidant (e.g., thermal oxidant, $O_2$, $N_2O$, etc., as discussed previously herein) during a third pulse of the ALD cycle.

Figure 11:
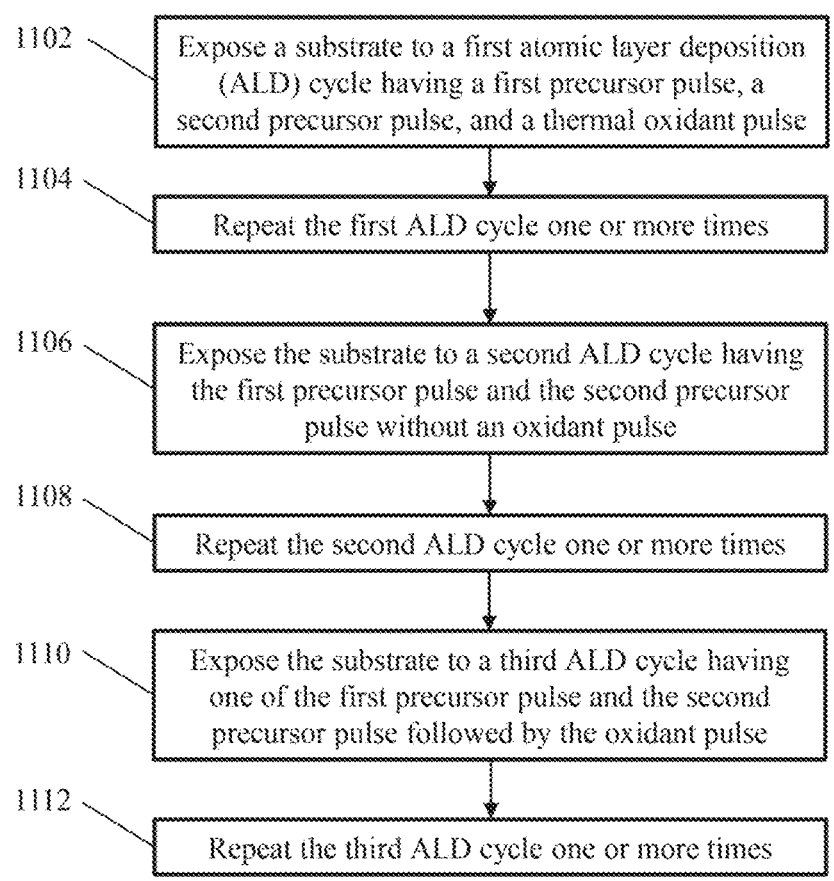
FIG. 11 depicts a flow diagram illustrating a method according to one or more embodiments of the invention.

FIG. 11 depicts a flow diagram 1100 illustrating a method for depositing a sub-stoichiometric metal-oxide according to one or more embodiments of the invention. As shown at block 1102, a substrate is exposed to a first ALD cycle having a first precursor pulse, a second precursor pulse, and an oxidant pulse (i.e., the M1La-M1Lb-O cycle described previously herein). The first precursor can include a metal and a first ligand and the second precursor can include the same metal and a second ligand. In some embodiments of the invention, the metal includes tantalum, the first ligand includes a chloride, and the second ligand includes a metalorganic. In some embodiments of the invention, the first precursor includes $HfCl_4$ and the second precursor includes hafnium and tetrakis-ethylmethylamino (TEMA). In some embodiments of the invention, the first precursor includes $TaCl_5$ and the second precursor includes tantalum and poly (2,5-dimethoxyaniline) (PDMA). At block 1104, the first ALD cycle is repeated one or more times.

At block 1106, the substrate is exposed to a second ALD cycle having the first precursor pulse and the second precursor pulse without a thermal oxidant pulse (i.e., the M1La-M1Lb cycle described previously herein). At block 1108, the second ALD cycle is repeated one or more times.

At block 1110, the substrate is exposed to a third ALD cycle having one of (not both of) the first precursor pulse and the second precursor pulse, followed by the thermal oxidant pulse (i.e., one of the M1La-O or M1Lb-O cycles described previously herein).

At block 1112, the third ALD cycle is repeated one or more times. In some embodiments of the invention, the repeated pulses are the same (e.g., all M1La-O or M1Lb-O cycles). In some embodiments of the invention, the repeated pulses vary (e.g., some M1La-O cycles and some M1Lb-O cycles). If varied, the M1La-O cycles and M1Lb-O cycles can be arbitrarily sequenced in any desired order (e.g., alternating or otherwise).

In some embodiments of the invention, a super-cycle includes the first ALD cycle, the second ALD cycle, and the third ALD cycle. In some embodiments of the invention, the super-cycle is repeated one or more times in the deposition of the sub-stoichiometric metal-oxide. The first ALD cycle and the second ALD cycle are sub-stoichiometric cycles and the third ALD cycle is stoichiometric in one or more exemplary embodiments.

Figure 12:
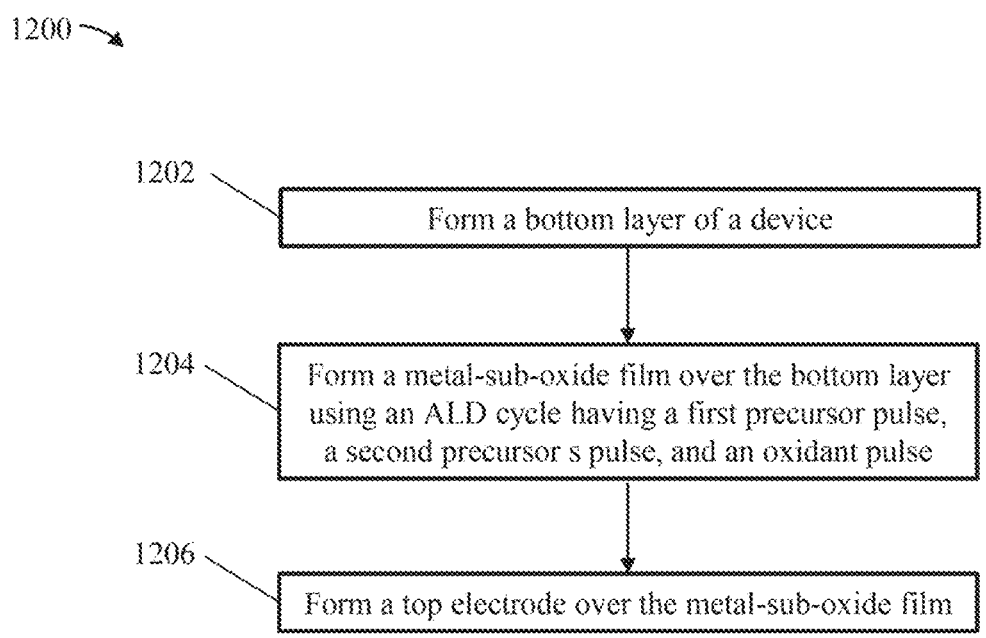
FIG. 12 depicts a flow diagram illustrating a method according to one or more embodiments of the invention.

FIG. 12 depicts a flow diagram 1200 illustrating a method for forming an electronic device having a sub-stoichiometric metal-oxide film according to one or more embodiments of the invention. As shown at block 1202, a bottom layer is formed. The bottom layer may include a metal such as the metal layer 51 as shown in FIGS. 13A, 13B, 13BB, 13C and 13DD. In some embodiments of the invention, the metal layer is later employed as a bottom electrode. The bottom electrode may include a metal-nitride and the metal-sub-oxide film includes $HfO_{2-x}$, $TaO_{2-x}$ or $Ta_2O_5$, in some exemplary embodiments.

At block 1204, a metal-sub-oxide film is formed over the bottom layer. The metal-sub-oxide film can be formed by exposing the bottom layer to an ALD cycle having a first precursor pulse, a second precursor pulse, and a thermal oxidant pulse. The first precursor can include a metal and a first ligand, and the second precursor can include the same metal and a second ligand. As shown in FIG. 13C, the metal-sub-oxide film is formed over a bottom metal layer 51 and on the sidewalls of a via that extends through both metal and dielectric layers.

At block 1206, a top electrode layer (metal layer 58 in FIG. 13C) is formed over the metal-sub-oxide film. In some embodiments of the invention such as the embodiment shown in FIG. 13C, the bottom layer includes a metal and the metal-sub-oxide film is an active area of an RRAM. In some embodiments of the invention, the bottom layer includes a semiconductor and a dielectric, and the metal-sub-oxide film is a charge trapping layer of a floating gate flash memory.

Figure 13D:
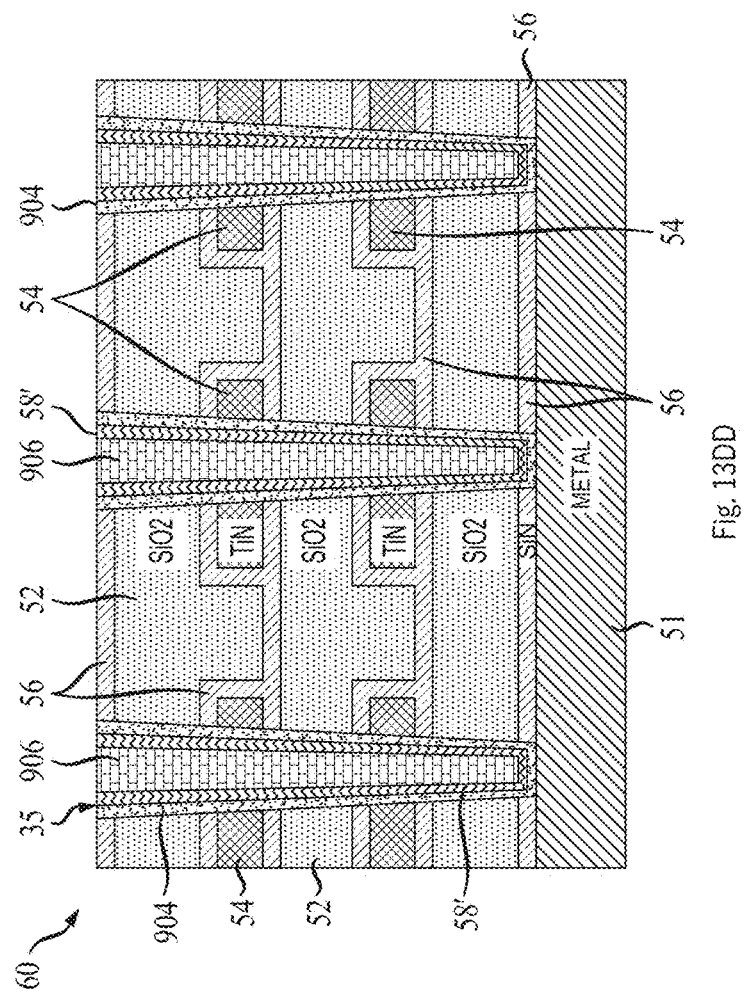
FIG. 13D is a top plan view of an array of RRAM devices following deposition of a fill metal within the vias.
Figure 13D:
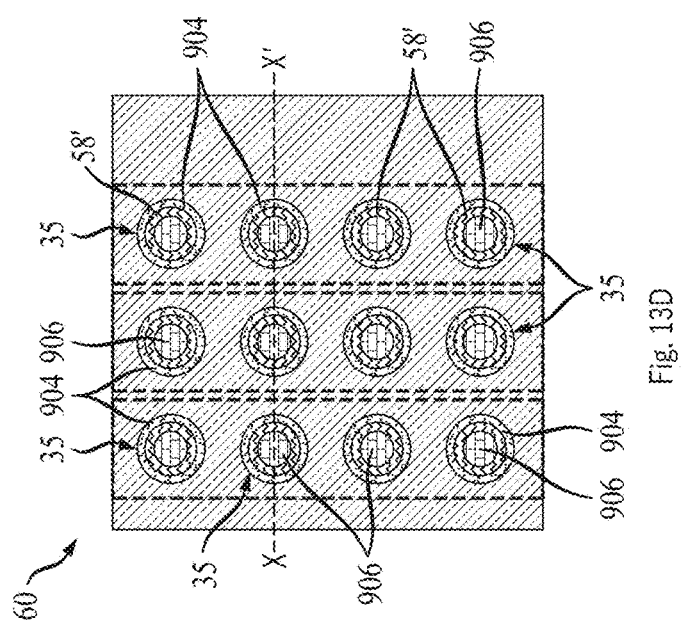

Referring to FIGS. 13D and 13DD, the vias 35 are filled with an electrically conductive material such as tungsten (W) or copper (Cu). The resulting structure is then subjected to chemical mechanical planarization down to the top silicon nitride layer 56. The resulting structure 60 includes an array of electrically isolated, laterally switching cells. Each cell includes a metal-insulator-metal stack comprising plate-like horizontal electrodes 54, a metal oxide layer 904 having one or more sub-stoichiometric regions, and an inner electrode 58' formed from the conformal metal layer 58. Electrically conductive fill metal 25 fills the space within the inner electrode 58' of each cell. The top surfaces of the fill metal 25 and inner electrode 58' are exposed following CMP. A top metal line (not shown) may be formed over the structure 60 and electrically connected to the inner electrode 58'.

Principles of the invention are schematically illustrated in FIGS. 14A and 14B.

FIG. 14A is a cross-sectional view of a portion of a structure 350 including a vertical electrode 906, a metal oxide layer MO1 (for example, hafnium oxide) having a graded sub-stoichiometric lateral profile, a second metal oxide layer MO2 (for example, aluminum oxide) that may or may not have a graded, sub-stoichiometric profile, and a dielectric layer 125. FIG. 14B illustrates three possible oxygen and corresponding impurity gradients that may be formed in conformal metal oxide layers using techniques as described above. The impurities present in the metal oxide layers are reaction byproducts generated during the ALD process employed in forming the metal oxide layers. The lateral oxygen/impurity gradients illustrated in the top of FIG. 14B include a center region that is substantially stoichiometric and sub-oxide interface regions that have relatively high impurity densities. The middle illustrations show lateral oxygen/impurity gradients wherein the interface regions are substantially stoichiometric and the center region is sub-stoichiometric with a relatively high impurity density. The bottom illustrations show a third alternative embodiment wherein one interface is substantially stoichiometric and the opposite interface is sub-stoichiometric with a relatively high impurity density. The center region of the third embodiment includes laterally decreasing oxygen density and laterally increasing impurity density in the direction of the sub-stoichiometric portion of the metal oxide layer. It will be appreciated that the oxygen/impurity gradients illustrated in FIG. 14B are exemplary and that the techniques described herein can be employed to form metal oxide layers having different sub-oxide regions or metal oxide layers that are entirely sub-oxide. Tuning of the device comprising the conformal metal oxide layer is facilitated by the ability to control oxygen/impurity densities during the ALD deposition of this layer.

Given the discussion thus far, an exemplary method of fabricating a laterally switching cell structure includes obtaining a substrate including a dielectric layer, an outer electrode layer, and a vertical via within the dielectric layer and depositing a conformal metal oxide layer including one or more sub-stoichiometric regions within the via and on the outer electrode. The conformal metal oxide layer is deposited by: 1) exposing the substrate to a first precursor during a first pulse of an atomic layer deposition (ALD) cycle, the first precursor including a metal and a first ligand; 2) exposing the substrate to a second precursor during a second pulse of the ALD cycle, the second pulse occurring directly after the first pulse, the second precursor including the metal and a second ligand, the first ligand and the second ligand reacting during the second pulse to form one or more reaction by-products; and 3) exposing the substrate to an oxidant during a third pulse of the ALD cycle. An inner electrode layer is deposited on the conformal metal oxide layer and extends within the via and adjoins the conformal metal oxide layer. Devices as illustrated in FIG. 9B, FIG. 9BB and FIG. 13D may be obtained. In one or more embodiments, the oxidant is a non-plasma-based thermal oxidant.

The step of depositing the conformal metal oxide layer may further include forming a first metal oxide region having a relatively low, sub-stoichiometric oxygen density and a relatively high density of the reaction by-products and forming a second metal oxide region laterally displaced with respect to the first metal oxide region and having a higher oxygen density and a lower density of reaction by-products than the first metal oxide region, as schematically illustrated in FIG. 14B. A graded, intermediate metal oxide region may be formed between the first metal oxide region and the second metal oxide region. The graded region has an increasing lateral oxygen density and decreasing density of reaction by-products in the direction of second metal oxide region, as further illustrated in FIG. 14B.

A further exemplary method of fabricating a laterally switching cell structure or part of an array of such structures includes obtaining a first structure 50 including a first electrode layer 54 including a plurality of discrete first electrode segments, a second electrode layer 54 above the first electrode layer, the second electrode layer including a plurality of discrete second electrode segments, a dielectric layer 52, the first and second electrode layers 54 being embedded within the dielectric layer, and a metal layer 51, the dielectric layer being positioned above the metal layer as schematically illustrated in FIG. 13A. Vertical vias 35 are formed through the first structure down to the metal layer 51, each of the vertical vias extending through one of the first electrode segments and one of the second electrode segments as schematically illustrated in FIG. 13BB. A conformal metal oxide layer 904 including one or more sub-stoichiometric regions is deposited on the first structure. Portions of the conformal metal oxide layer adjoin the first electrode segments and the second electrode segments. Depositing the conformal metal oxide layer includes exposing the first structure to a first precursor during a first pulse of an atomic layer deposition (ALD) cycle, the first precursor including a metal and a first ligand and exposing the first structure to a second precursor during a second pulse of the ALD cycle, the second pulse occurring directly after the first pulse. The second precursor including the metal and a second ligand, the first ligand and the second ligand reacting during the second pulse to form one or more reaction by-products. The first structure is exposed to an oxidant during a third pulse of the ALD cycle. An inner electrode layer 906 such as a metal fill layer is deposited on the first structure and extends within the vias and adjoins the conformal metal oxide layer. FIG. 13DD shows an exemplary structure 60 that may be obtained. The ALD cycle is conducted at or below 400° C. and is employed during BEOL processing in some embodiments.

An exemplary laterally switching cell structure in accordance with the invention includes a dielectric substrate, a via extending vertically within the dielectric substrate, and a conformal metal oxide layer within the via and including one or more sub-stoichiometric regions. The one or more sub-stoichiometric regions include atomic layer deposition reaction by-products therein. An inner electrode layer extends within the via and adjoins an inner surface of the conformal metal oxide layer. An outer electrode layer adjoins an outer surface of the conformal metal oxide layer. In some embodiments, the inner electrode includes a conformal metal layer such as electrode 20 of the device 120 shown in FIG. 9BB or the electrodes 58' shown in FIG. 13DD. The conformal metal oxide layer includes one or more graded regions having a laterally graded oxygen density in some embodiments, as schematically illustrated in FIG. 14B. The one or more graded regions of the conformal metal oxide layer having a laterally graded density of the atomic layer deposition reaction by-products corresponding inversely to the laterally graded oxygen density. In one or more embodiments, the conformal metal oxide layer includes a first metal oxide region having a relatively low, sub-stoichiometric oxygen density and a relatively high density of the reaction by-products and a second metal oxide region laterally displaced with respect to the first metal oxide region. The second metal oxide region has a higher oxygen density and a lower density of reaction by-products than the first metal oxide region. A graded, intermediate metal oxide region may be located between the first metal oxide region and the second metal oxide region. The graded region has an increasing lateral oxygen density and decreasing density of reaction by-products (for example, chlorine and carbon) in the direction of second metal oxide region. The ALD reaction by-products may include one or more of nitrogen, chlorine and carbon depending on the ligands employed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

The illustrations of embodiments described herein are intended to provide a general understanding of the various embodiments, and they are not intended to serve as a complete description of all the elements and features of apparatus and systems that might make use of the techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

The flowchart and block diagrams in the Figures illustrate possible implementations of fabrication and/or operation methods according to various embodiments of the present invention. Various functions/operations of the method are represented in the flow diagram by blocks. In some alternative implementations, it may be possible for one or more functions noted in the blocks to occur out of the order noted in the Figures. For example, two blocks shown in succession can, in fact, be executed substantially concurrently, or the blocks can sometimes be executed in the reverse order, depending upon the functionality involved.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can possibly be substituted for the specific embodiment(s) shown. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications may be made therein by one skilled in the art without departing from the scope of the appended claims.

What is claimed is:

1. An electronic structure including one or more laterally switching cell structures, comprising:
   a dielectric substrate;
   a via extending vertically within the dielectric substrate;
   a conformal metal oxide layer within the via and including one or more sub-stoichiometric regions, the one or more sub-stoichiometric regions further including atomic layer deposition reaction by-products therein; and
   an inner electrode layer including a metal fill layer extending within the via and adjoining an inner surface of the conformal metal oxide layer; and
   an outer electrode layer adjoining an outer surface of the conformal metal oxide layer, the conformal metal oxide layer, the inner electrode layer and the outer electrode layer comprising a first cell structure configured for lateral switching.

2. The laterally switching cell structure of claim 1, wherein the inner electrode layer further includes a conformal metal layer adjoining the inner surface of the conformal metal oxide layer.

3. The laterally switching cell structure of claim 1, wherein the conformal metal oxide layer includes one or more graded regions having a laterally graded oxygen density, the one or more graded regions of the conformal metal oxide layer further having a laterally graded density of the atomic layer deposition reaction by-products corresponding inversely to the laterally graded oxygen density.

4. The laterally switching cell structure of claim 1, wherein the conformal metal oxide layer further includes:
   a first metal oxide region having a relatively low, sub-stoichiometric oxygen density and a relatively high density of the reaction by-products; and
   a second metal oxide region laterally displaced with respect to the first metal oxide region and having a higher oxygen density and a lower density of reaction by-products than the first metal oxide region.

5. The laterally switching cell structure of claim 4, wherein the conformal metal oxide layer further includes:
   a graded, intermediate metal oxide region between the first metal oxide region and the second metal oxide region having an increasing lateral oxygen density and decreasing density of reaction by-products in the direction of second metal oxide region.

6. The laterally switching cell structure of claim 4, wherein the conformal metal oxide layer further includes:
   a first metal oxide sublayer having a first chemical composition within the via, the first metal oxide sublayer having a graded, sub-stoichiometric lateral oxygen profile; and
   a second metal oxide sublayer having a second chemical composition over the first metal oxide sublayer, the second metal oxide sublayer having a second chemical composition different from the first chemical composition, the inner electrode layer adjoining the second metal oxide sublayer.

7. The laterally switching cell structure of claim 4, further including:
   one or more further vias extending vertically within the dielectric substrate, the conformal metal oxide layer and the inner electrode layer including portions extending within the one or more further vias; and
   wherein the outer electrode layer includes a plurality of discrete, electrically isolated first electrode segments, each of the first electrode segments adjoining an outer surface of the conformal metal oxide layer;
   the portions of the conformal metal oxide layer extending within the one or more further vias, the portions of the inner electrode layer extending within the one or more further vias, and one or more of the first electrode segments comprising one or more second cell structures configured for lateral switching.

* * * * *